US011526050B2

(12) United States Patent
Chen et al.

(10) Patent No.: US 11,526,050 B2
(45) Date of Patent: Dec. 13, 2022

(54) DISPLAY DEVICE

(71) Applicant: InnoLux Corporation, Miao-Li County (TW)

(72) Inventors: Jia-Yuan Chen, Miao-Li County (TW); Kuan-Feng Lee, Miao-Li County (TW); Tsung-Han Tsai, Miao-Li County (TW); Yuan-Lin Wu, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 159 days.

(21) Appl. No.: 15/972,439

(22) Filed: May 7, 2018

(65) Prior Publication Data

US 2019/0339570 A1 Nov. 7, 2019

(51) Int. Cl.
G02F 1/1335 (2006.01)
G02F 1/1339 (2006.01)
H01L 27/15 (2006.01)
H01L 27/32 (2006.01)
H01L 51/00 (2006.01)

(52) U.S. Cl.
CPC ...... *G02F 1/133528* (2013.01); *G02F 1/1339* (2013.01); *G02F 1/133514* (2013.01); *H01L 27/156* (2013.01); *H01L 27/3232* (2013.01); *H01L 51/0097* (2013.01); *G02F 1/133548* (2021.01); *G02F 2201/16* (2013.01); *G02F 2201/50* (2013.01); *G02F 2202/28* (2013.01)

(58) Field of Classification Search
CPC ......... G02F 1/133528; G02F 1/133514; G02F 1/1339; G02F 2001/133548; G02F 2201/16; G02F 2201/50; G02F 2202/28; G02F 1/13336; H01L 27/156; H01L 27/3232; H01L 51/0097
USPC ........................................................ 349/73
See application file for complete search history.

(56) References Cited

U.S. PATENT DOCUMENTS 8,497,956 B2    7/2013   Jung et al.
8,934,069 B2 *  1/2015   Nishizawa ........ G02F 1/136209
                                                         349/62

(Continued)

FOREIGN PATENT DOCUMENTS

CN    107507906 A    12/2017
KR    20110110593 A  10/2011

OTHER PUBLICATIONS

EP Partial Search Report dated Jul. 26, 2019 for the Corresponding Application No. EP19172068.9 in Europe, pp. 1-13.

(Continued)

*Primary Examiner* — Edward J Glick
*Assistant Examiner* — David Y Chung
(74) *Attorney, Agent, or Firm* — McClure, Qualey & Rodack, LLP

(57) ABSTRACT

A display device is provided. The display device includes a first substrate, a first display structure disposed on the first substrate and a second display structure disposed on the first substrate. The first display structure and the second display structure are different from each other and are selected from a liquid-crystal display, an organic light-emitting diode display, an inorganic light-emitting diode display or a laser display. The display device also includes a first polarizing structure. The first polarizing structure is disposed on the first display structure and the second display structure.

19 Claims, 20 Drawing Sheets

(56) References Cited

U.S. PATENT DOCUMENTS

| | | | |
|---|---|---|---|
| 10,325,894 B1* | 6/2019 | Pan | H01L 27/156 |
| 10,930,570 B2 | 2/2021 | Chang et al. | |
| 2007/0153172 A1* | 7/2007 | Hsieh | G02F 1/133377 |
| | | | 349/114 |
| 2009/0185098 A1* | 7/2009 | Bae | G02B 6/0045 |
| | | | 349/73 |
| 2013/0050066 A1* | 2/2013 | Li | G02F 1/13 |
| | | | 345/76 |
| 2017/0025484 A1* | 1/2017 | Forrest | H01L 51/56 |
| 2017/0286044 A1* | 10/2017 | Kim | H01L 27/3265 |
| 2018/0217433 A1* | 8/2018 | Tang | G02F 1/133305 |

OTHER PUBLICATIONS

Chinese language office action dated Sep. 3, 2021, issued in application No. CN 201910348577.4.

KR Office Action dated Sep. 13, 2022 in Korean application No. 10-2018-0068899.

* cited by examiner

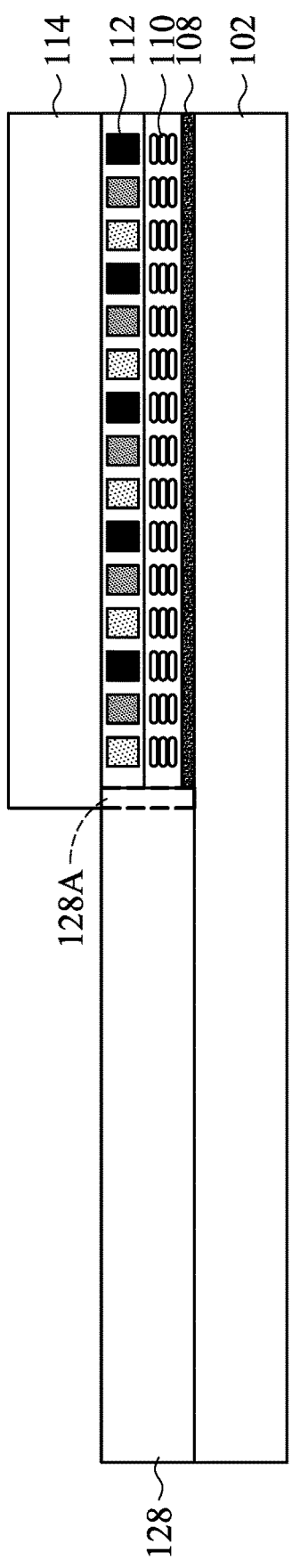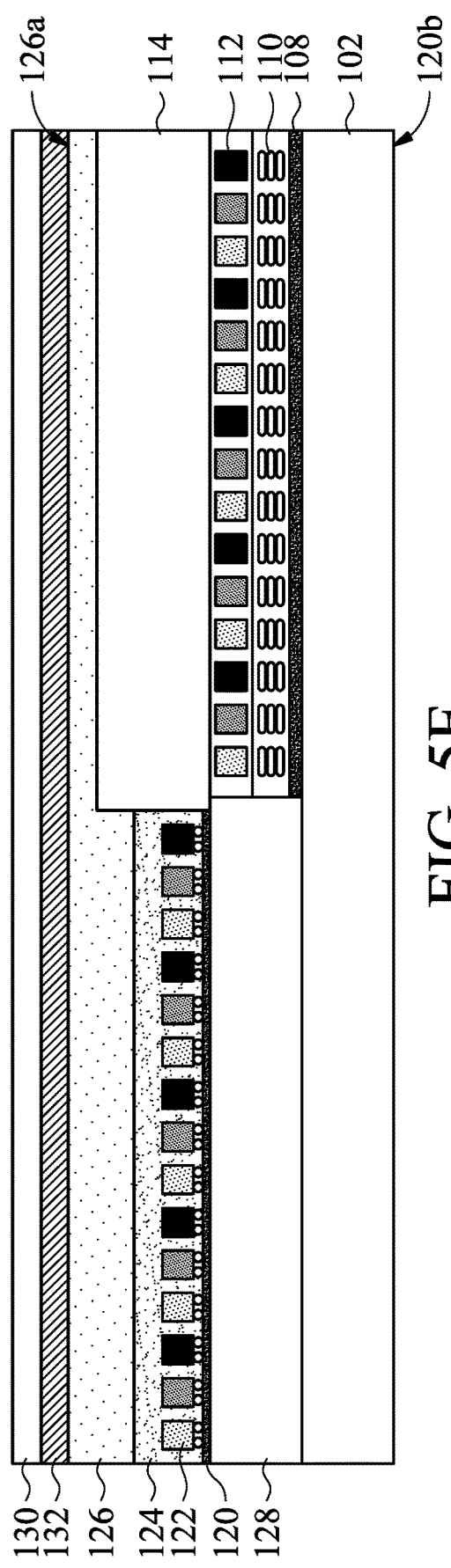

DISPLAY DEVICE

BACKGROUND

Technical Field

The present disclosure relates to a display device. The disclosure in particular relates to a hybrid display device.

Description of the Related Art

Electronic products that come with a display panel, such as smartphones, tablets, notebooks, monitors, and TVs, have become indispensable necessities in modern life. With the flourishing development of such portable electronic products, consumers have higher expectations regarding quality, functionality, and price. The development of next-generation display devices has been focused on techniques that are energy-saving and environmentally friendly.

Different types of light-emitting structures have different performance characteristics that are more or less useful in different circumstances or when used in different ways. Hybrid display devices combining different types of light-emitting structures have recently been developed. Hybrid display devices may possess multiple characteristics, advantages, or functions because they have different types of light-emitting structures.

However, the mechanism that emits light and the configuration of the light sources can vary in the different types of light-emitting structures. Heterogeneities in light intensity or resolution may be present between different types of light-emitting structures, especially at the boundaries where different types of light-emitting structures are integrated. As such, the visual quality may be not uniform in the hybrid display device.

Accordingly, it is desirable to develop a design that can effectively reduce heterogeneity in the hybrid display device.

SUMMARY

In accordance with some embodiments of the present disclosure, a display device is provided. The display device includes a first substrate; a first display structure disposed on the first substrate; a second display structure disposed on the first substrate; and a first polarizing structure; wherein the first display structure and the second display structure are different from each other and are selected from a group consisting of: a liquid-crystal display; an organic light-emitting diode display; an inorganic light-emitting diode display; and a laser display; and wherein the first polarizing structure is disposed on the first display structure and the second display structure.

In accordance with some embodiments of the present disclosure, a display device is provided. The display device includes a first display unit, comprising: a first substrate; a first display structure disposed on the first substrate; a second display structure disposed on the first substrate; and a first polarizing structure disposed on the first display structure and the second display structure; wherein the first display structure and the second display structure are different from each other and are selected from a group consisting of: a liquid-crystal display; an organic light-emitting diode display; an inorganic light-emitting diode display; and a laser display; and a second display unit connected to the first display unit along a first direction in a side-by-side manner, comprising: a third substrate; a third display structure disposed on the third substrate; a fourth display structure disposed on the third substrate; and a third polarizing structure disposed on the third display structure and the fourth display structure; wherein the third display structure and the fourth display structure are different from each other and are selected from a group consisting of: a liquid-crystal display; an organic light-emitting diode display; an inorganic light-emitting diode display; and a laser display.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIGS. 5A-5E illustrate the cross-sectional views of the display device during the manufacturing process in accordance with some embodiments of the present disclosure.

DETAILED DESCRIPTION

Figure 1:
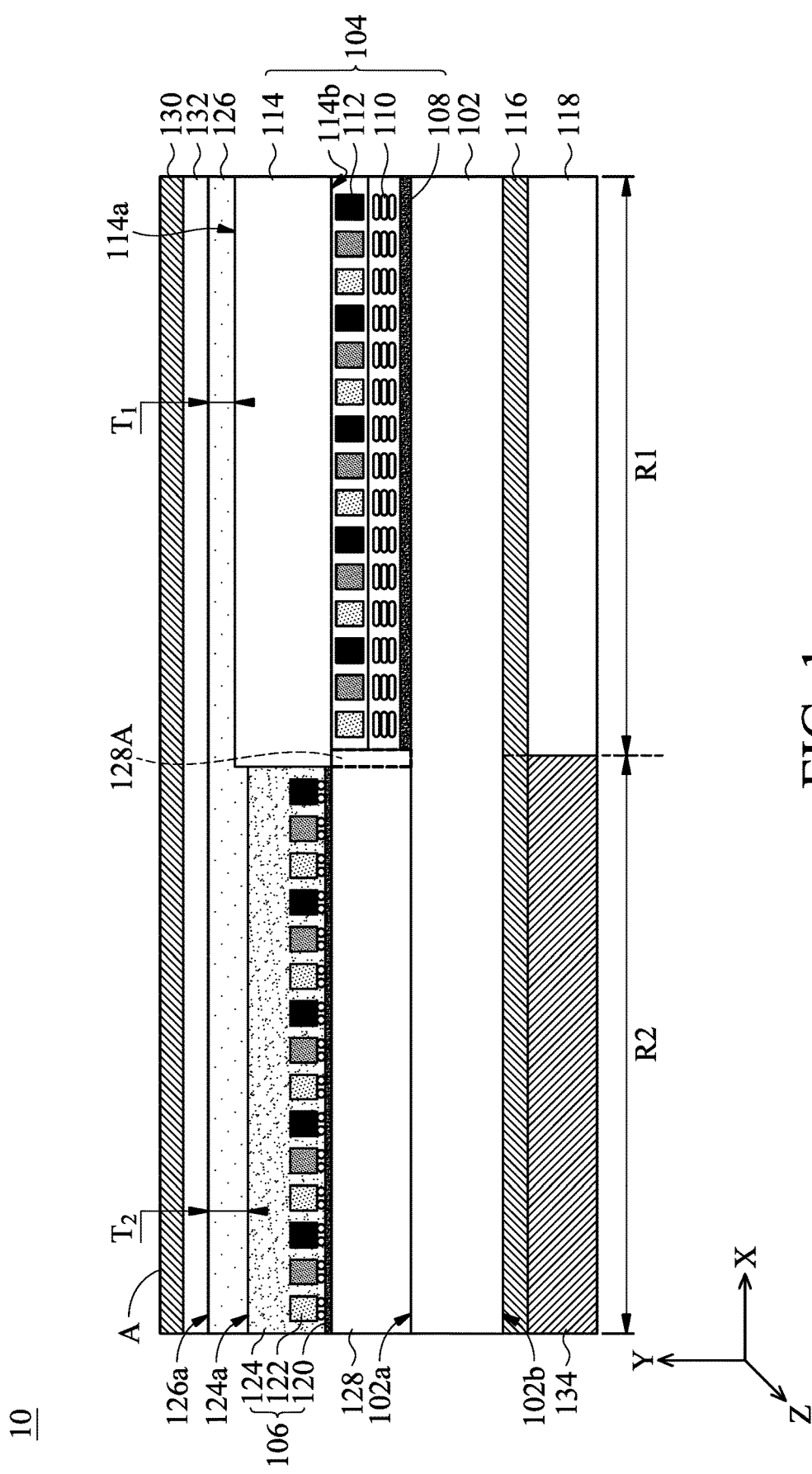
FIG. 1 illustrates a cross-sectional view of a display device in accordance with some embodiments of the present disclosure.

The display device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "about" and "substantially" typically mean +/− 20% of the stated value, more typically +/− 10% of the stated value, more typically +/− 5% of the stated value, more typically +/− 3% of the stated value, more typically +/− 2% of the stated value, more typically +/− 1% of the stated value and even more typically +/− 0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 illustrates a cross-sectional view of a display device 10 in accordance with some embodiments of the present disclosure. It should be understood that additional features may be added to the display device in some embodiments of the present disclosure. In some other embodiments of the present disclosure, some of the features described below may be replaced or eliminated.

Referring to FIG. 1, the display device 10 may include a first substrate 102, a first display structure 104 and a second display structure 106. The first substrate 102 includes a first region R1 and a second region R2. The first display structure 104 is disposed on the first region R1 of the first substrate 102, and the second display structure 106 is disposed on the second region R2 of the first substrate 102. The first display device 104 is disposed adjacent to the second display structure 106. In some embodiment, the first display device 104 is in contact with the second display structure 106. The first display structure 104 and the second display structure 106 are each selected from a group consisting of a liquid-crystal display, an organic light-emitting diode display, an inorganic light-emitting diode display and a laser display. However, the first display structure 104 is different from the second display structure 106. In some embodiments, the resolution of the first display structure 104 is different from the resolution of the second display structure 106. In some embodiments, the resolution of the first display structure 104 is the same as the resolution of the second display structure 106.

For example, as shown in FIG. 1, the first display structure 104 can be a liquid-crystal display and the second display structure 106 can be an inorganic light-emitting diode display. The inorganic light-emitting diode display can be mini LED display or micro LED display in accordance with some embodiments of the present disclosure. For example, the cross-sectional area of the micro LED may have a length of about 1 μm to about 150 μm and may have a width ranging from about 1 μm to about 150 μm. In some embodiments, the micro LED may have a size ranging from about 1 μm×1 μm×1 μm to about 150 μm×150 μm×150 μm.

Specifically, in this embodiment, the first display structure 104 (a liquid-crystal display) includes a second substrate 114 disposed opposite to the first substrate 102. The first substrate 102 has a first side 102a and a second side 102b, and the second substrate 114 has a first side 114a and a second side 114b. The second substrate 114 is disposed on the first side 102a of the first substrate 102, such that the first side 102a of the first substrate 102 and the second side 114b of the second substrate 114 face to each other. A first driving layer 108 is disposed on the first side 102a of the first substrate 102, a color filter layer 112 is disposed on the second side 114b of the second substrate 114, and a liquid crystal layer 110 is disposed between the first driving layer 108 and the color filter layer 112.

The first driving layer 108 may serve as a switch for the first display structure 104. In some embodiments, the first driving layer 108 may include an active driving circuit including thin-film transistors (TFT) or a passive driving circuit. In some other embodiments, the first driving layer 108 may be controlled by an IC or a microchip. The liquid-crystal layer 110 is formed of liquid-crystal molecules. The color filter layer 112 may include, but is not limited to, red light filter, green light filter and blue light filter. In addition, the materials of the first substrate 102 and the second substrate 114 may include, but are not limited to, glass, quartz, sapphire, silicon wafer, polycarbonate (PC), polyimide (PI), polyethylene terephthalate (PET), liquid-crystal polymers (LCP), rubbers, glass fibers, ceramics, other polymer materials, any other suitable substrate material, or a combination thereof. The first substrate 102 and the second substrate 114 may be a flexible substrate in accordance with some embodiments. Moreover, the first substrate 102 and the second substrate 114 may be transparent or semi-transparent so as not to significantly degrade the light extraction efficiency of the backlight unit 118 in accordance with some embodiments where a backlight source is present. In some embodiments, the material of the first substrate 102 is the same as that of the second substrate 114. In some embodiments, the material of the first substrate 102 is different from that of the second substrate 114.

Figure 9:
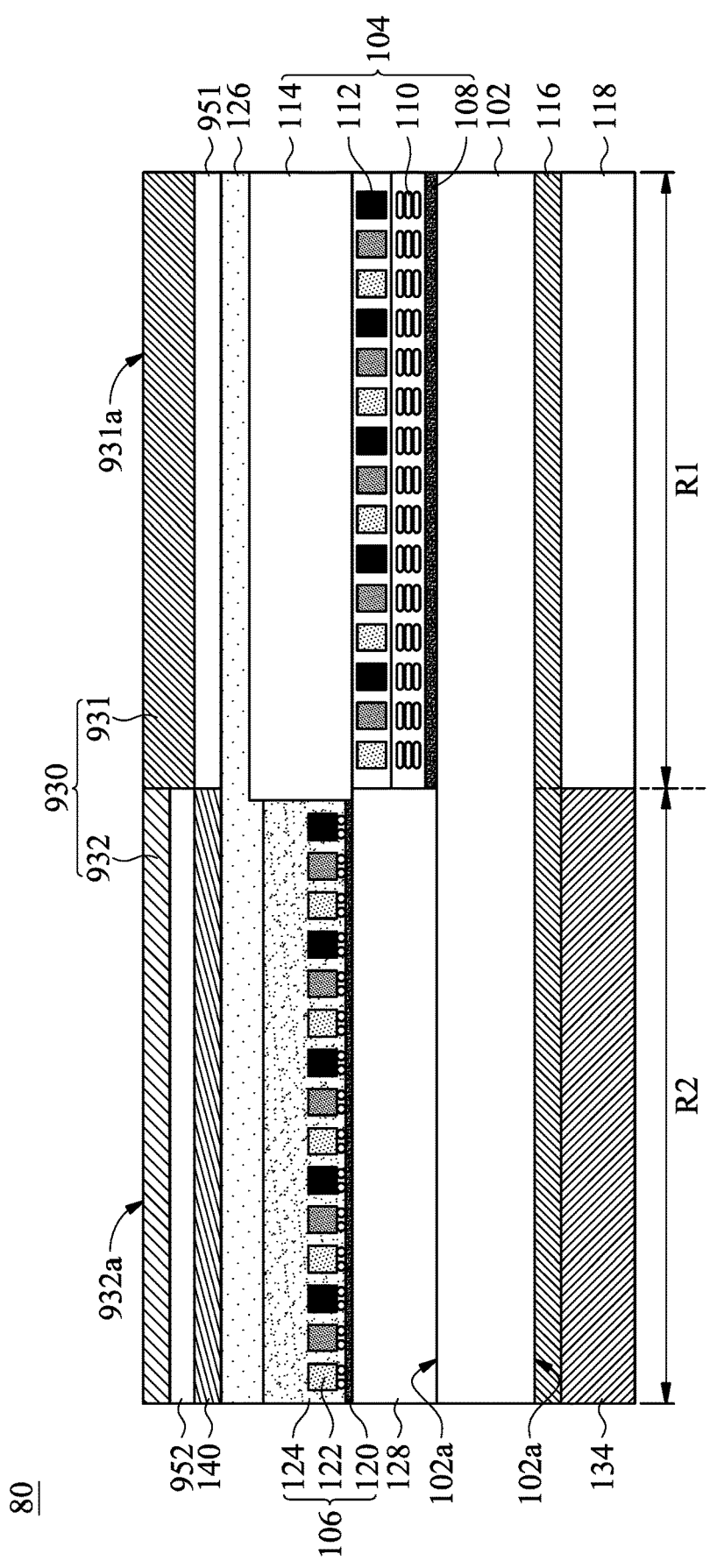
FIG. 9 illustrates a cross-sectional view of a display device in accordance with some embodiments of the present disclosure.

Still referring to FIG. 1, the display device 10 further includes a first polarizing structure 130 disposed on the first side 102a of the first substrate 102. Specifically, the first polarizing structure 130 is disposed on the first display structure 104 and the second display structure 106. In some embodiments, the first polarizing structure 130 can be a continuous layer, as shown in FIG. 1. Alternatively, in other embodiments, the first polarizing structure 130 can include two separate layers. For example, as shown in FIG. 9, the first polarizing structure 930 includes a polarizing layer 931 disposed on the first display structure 104 and a polarizing layer 932 disposed on the second display structure 106. In addition, a second polarizing structure 116 may be further disposed on the second side 102b of the first substrate 102. Similarly, the second polarizing structure 116 can be a continuous layer or two separate layers in the first region R1 and the second region R2. In addition, a backlight unit 118 can be disposed on the second side 102b of the first substrate 102 and below the second polarizing structure 116, to provide light source to the first display structure 104 in the first region R1.

The material of the first polarizing structure 130 and the second polarizing structure 116 can include, but are not limited to, poly vinyl alcohol (PVA), any other suitable materials or a combination thereof. For example, the first polarizing structure 130 and the second polarizing structure 116 can include a PVA film with a triacetyl cellulose (TAC) film serving as a protective layer in accordance with some embodiments. In some embodiments, the first polarizing structure 130 and the second polarizing structure 116 can include a metal patterned layer such as a wire grid polarizer (WGP). The backlight unit 118 may include, but is not limited to, a light-emitting diode, a micro light-emitting diode, electroluminescence, any other suitable light-emitting element, or a combination thereof. The materials of the backlight unit 118 may include, but are not limited to, quantum dot (QD) materials, fluorescence materials, phosphor materials, any other suitable light-emitting materials, or a combination thereof. In some embodiments, the backlight unit 118 may emit white light, green light, blue light, yellow light, a light of any other suitable color, or a light of any other suitable wavelength, but it is not limited thereto. In this embodiment, the backlight unit 118 may emit white light.

Still referring to FIG. 1, on the other hand, the second display structure 106 (for example, an inorganic light-emitting diode display) may include a second driving layer 120, a first light-emitting layer 122 disposed on and electrically connected to the second driving layer 120, and a first encapsulation layer 124 disposed on the first light-emitting layer 122. In other words, the first light-emitting layer 122 is encapsulated by the first encapsulation layer 124, which may prevent moisture or oxygen from damaging the first light-emitting layer 122.

In some embodiments, the second driving layer 120 may be a printed circuit board (PCB). In some embodiments, the second driving layer 120 may include an active driving circuit including thin-film transistors (TFT) or a passive driving circuit. In some other embodiments, the second driving layer 120 may be controlled by an IC or a microchip. The first light-emitting layer 122 may include the pixels of the light-emitting diode, the pixels of the micro light-emitting diode, or a combination thereof. In some embodiments, the first light-emitting layer 122 may include, but is not limited to, the subpixels for emitting red light, green light and blue light.

In some embodiments, the first encapsulation layer 124 may be transparent or semi-transparent so as not to significantly degrade the light extraction efficiency of the first light-emitting layer 122. The first encapsulation layer 124 may be formed of organic material, inorganic material, or combinations thereof. In some embodiments, the inorganic material may include, but is not limited to, silicon nitride, silicon oxide, silicon oxynitride, aluminum oxide, any other suitable encapsulation materials, or a combination thereof. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS), polyfluoroalkoxy (PFA), epoxy, any other suitable protective materials, or a combination thereof. In some embodiments, the first encapsulation layer 124 may be formed by using chemical vapor deposition (CVD), spin-on coating, printing or a combination thereof.

As shown in FIG. 1, the top surface 124a of the first encapsulation layer 124 may be not level with the surface of the first side 114a of the second substrate 114 in accordance with some embodiments. A protecting layer 126 can be further disposed on the first display structure 104 and the second display structure 106 to obtain a substantially flat or planar surface, on which an optical film can be formed easily. For example, the first polarizing structure 130 can be adhered to the protecting layer 126 by a first adhesive layer 132. Specifically, the protecting layer 126 may be disposed on the first side 114a of the second substrate 114 of the first display structure 104 and on the first encapsulation layer 124 of the second display structure 106. The first polarizing structure 130 can be a continuous layer and extend on both the first display structure 104 and the second display structure 106. A portion of the protecting layer 126 that is disposed on the first display structure 104 (in the first region R1) has a first thickness $T_1$ and another portion of the protecting layer 126 that is disposed on the second display structure 106 (in the second region R2) has a second thickness $T_2$. In some embodiments, the first thickness $T_1$ is not equal to the second thickness $T_2$. In other words, a portion of the protecting layer 126 that is disposed on the first display structure 104 and another portion of the protecting layer 126 that is disposed on the second display structure 106 are different in thickness. In some embodiments, the first thickness $T_1$ can be smaller than the second thickness $T_2$. As described above, the top surface 126a of the protecting layer 126 is substantially planarized in accordance with some embodiments. The protecting layer 126 may serve as a planarization layer.

In some embodiments, the protecting layer 126 may be transparent or semi-transparent so that the light extraction efficiency of the first display structure 104 and the second display structure 106 may be less affected. The protecting layer 126 may be formed of organic materials, inorganic materials, or combinations thereof. In some embodiments, the inorganic material may include, but is not limited to, silicon nitride, silicon oxide, silicon oxynitride, aluminum oxide, any other suitable encapsulation materials, or a combination thereof. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS), polyfluoroalkoxy (PFA), any other suitable protective materials, or a combination thereof. In some embodiments, the protecting layer 126 may be formed by using chemical vapor deposition (CVD), spin-on coating, printing or a combination thereof.

In addition, the display device 10 may further include a sealing portion 128 disposed adjacent to the liquid-crystal layer 110. The sealing portion 128 can be disposed on the first side 102a of the first substrate 102 in the second region R2, and can prevent the liquid-crystal molecule of the liquid-crystal layer 110 from leakage. The sealing portion 128 can at least partially overlap the second substrate 114 in accordance with some embodiments. In other words, at least a portion of the sealing portion 128 is disposed between the first substrate 102 and the second substrate 114, which is labeled as 128A in FIG. 1. The sealing portion 128 may be in contact with the liquid-crystal layer 110, the color filter layer 112 of the first display structure 104, and the second driving layer 120 of the second display structure 106.

The sealing portion 128 may include, but is not limited to, sealant glue. The sealing portion 128 may be formed of a single material or the composite layers of the following materials. For example, the material of the sealing portion 128 may include, but is not limited to, polyethylene terephthalate (PET), polyethylene (PE), polyethersulfone (PES), polycarbonate (PC), polymethylmethacrylate (PMMA), epoxy or glass. In some embodiments, the sealing portion 128 may be a photo-curing sealant (UV light or general visible light), a thermal curing sealant, or a photothermal curing sealant. In addition, in some embodiments, the sealing portion 128 may be formed by coating, spraying, screen printing, any other suitable methods, or a combination thereof, but it is not limited thereto.

In addition, the display device 10 may further include a panel driving portion 134 to control or process the signals of the first driving layer 108 of the first display structure 104 and the second driving layer 120 of the second display structure 106 via separate routes (not shown). The panel driving portion 134 may provide signals to control the switching on or off of the display structures. The panel driving portion 134 may include the signal circuits and the driving circuits for controlling the panel. In some embodiments, the panel driving portion 134 can be a printed circuit board (PCB) or a chip on film (COF) structure. The panel driving portion 134 may include an active driving circuit or a passive driving circuit. In some embodiments, the panel driving portion 134 may be controlled by an IC or a microchip. The panel driving portion 134 can be disposed on a position corresponding to the second region R2, as shown in FIG. 1, and can also be disposed on a position corresponding to the first region R1, or corresponding to both the first region R1 and the second region R2.

Figure 2:
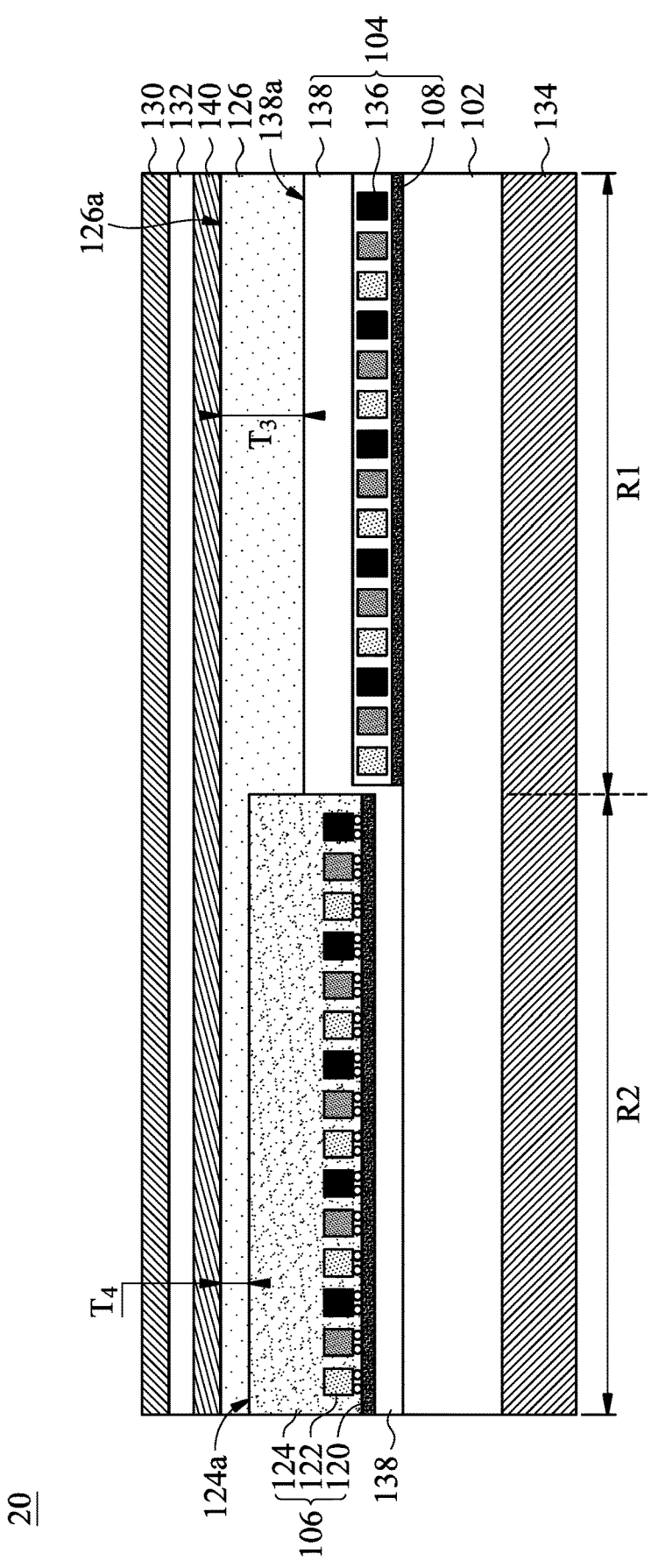
FIG. 2 illustrates a cross-sectional view of a display device in accordance with some embodiments of the present disclosure.

Next, referring to FIG. 2, FIG. 2 illustrates a cross-sectional view of a display device 20 in accordance with some embodiments of the present disclosure. It should be understood that the same or similar elements or layers in above and below contexts are represented by the same or similar reference numerals. The materials, manufacturing methods and functions of these elements or layers are the same or similar to those described above, and thus will not be repeated herein. FIG. 2 differs from FIG. 1 in that the first display structure 104 is replaced by an organic light-emitting diode display. The second display structure 106 is an inorganic light-emitting diode display, which is similar to the second display structure in FIG. 1.

As shown in FIG. 2, the first display device 104 includes a second light-emitting layer 136 disposed on the first driving layer 108 and a second encapsulation layer 138 disposed on the second light-emitting layer 136. The second encapsulation layer 138 is disposed between the protecting layer 126 and the second light-emitting layer 136 to encapsulate the second light-emitting layer 136. The second encapsulation layer 138 may prevent moisture or oxygen from damaging the second light-emitting layer 136. In some embodiments, the second encapsulation layer 138 may be in contact with the first encapsulation layer 124 of the second display structure 106.

The second light-emitting layer 136 may include the pixels of the OLED. In some embodiments, the light-emitting layer 136 may include, but is not limited to, the subpixels for emitting red light, green light and blue light. In some embodiments, the second encapsulation layer 138 may be transparent or semi-transparent so as not to significantly degrade the light extraction efficiency of the second light-emitting layer 136. The second encapsulation layer 138 can be formed of material similar to that of the first encapsulation layer 124 as mentioned above, and thus is not repeated herein.

As shown in FIG. 2, in some embodiments, the second encapsulation layer 138 can extend from the first region R1 to the second region R2. In other embodiments, the second encapsulation layer 138 can be disposed only in the first region R1, but not in the second region R2. After the first encapsulation layer 124 and the second encapsulation layer 138 are formed, the top surface 124a of the first encapsulation layer 124 may be not level with the top surface 138a of the second encapsulation layer 138 in accordance with some embodiments. A protecting layer 126 can be further disposed on the second encapsulation layer 138 in the first region R1 and the first encapsulation layer 124 in the second region R2 to obtain a substantially flat or planar surface, on which an optical film can be formed easily. For example, a retardation layer 140 can be disposed on the top surface 126a of the protecting layer 126. Moreover, the first polarizing structure 130 can be adhered to the retardation layer 140 by a first adhesive layer 132. In this embodiment, a portion of the protecting layer 126 that is disposed on the first display structure 104 has a third thickness $T_3$ and another portion of the protecting layer 126 that is disposed on the second display structure 106 has a fourth thickness $T_4$. In some embodiments, the third thickness $T_3$ is not equal to the fourth thickness $T_4$. In some embodiments, the third thickness $T_3$ is greater than the fourth thickness $T_4$. As described above, the top surface 126a of the protecting layer 126 is substantially planarized in accordance with some embodiments.

In addition, the retardation layer 140 may possess anti-reflective characteristics. In some embodiments, the retardation layer 140 may be a circular polarizer (¼ wave retarder). In particular, the combination of the retardation layer 140 and the first polarizing structure 130 may provide anti-reflection effect for the display device 20.

The retardation layer 140 may be formed of composite materials having birefringence characteristics. In some embodiments, the material of the retardation layer 140 may include, but is not limited to, triacetyl cellulose (TAC), N-triacetyl cellulose (N-TAC), cyclic olefin polymer (COP), polyimide (PI), any other suitable protective materials, metamaterials, dielectrics, metal meshes, or a combination thereof. In some embodiments, the retardation layer 140 may have a multilayer structure. In some embodiments, the retardation layer 140 may be formed by using chemical vapor deposition (CVD), spin-on coating, printing, evaporation, sputtering, any other suitable methods or a combination thereof. In some embodiments, a ready-made retardation layer may be directly disposed on the protecting layer 126 using a suitable adhesive.

Figure 3:
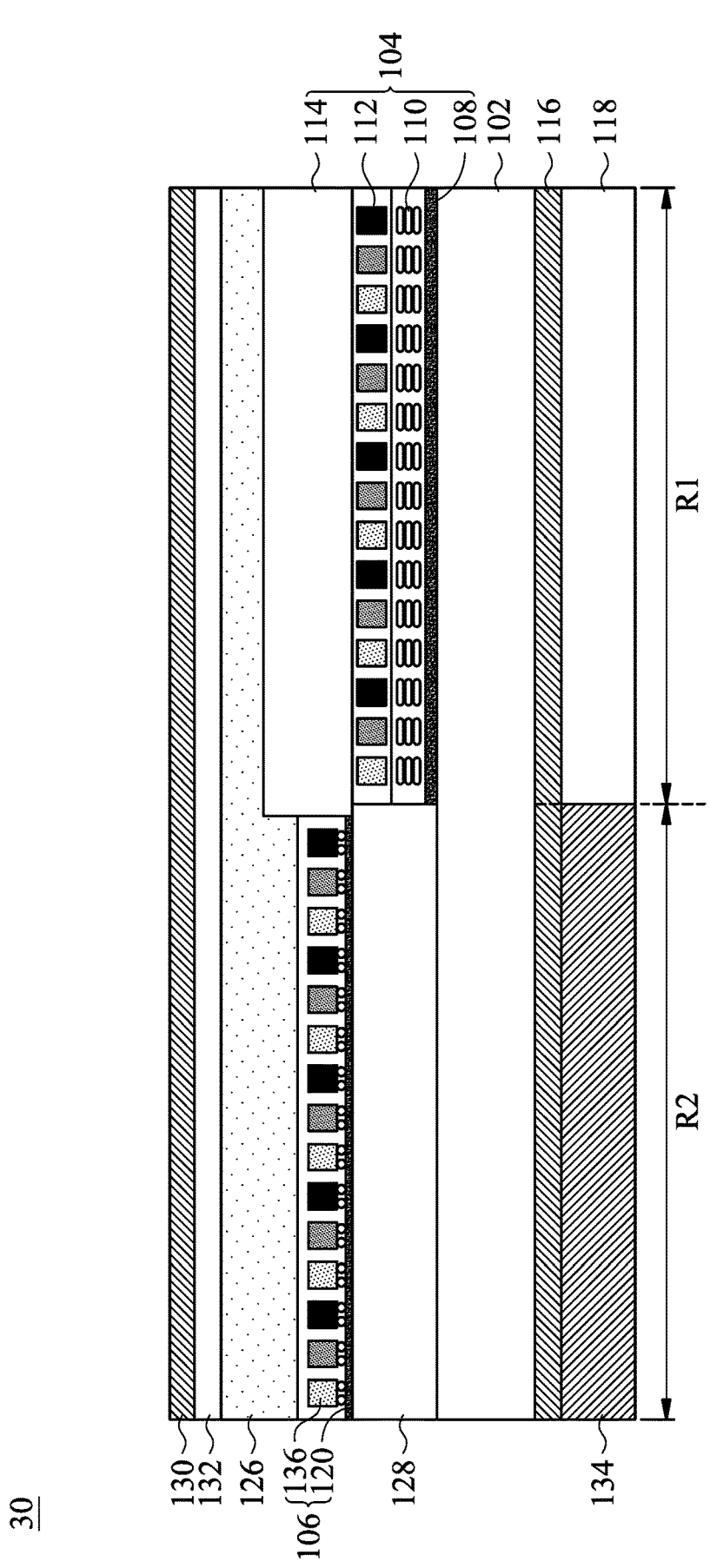
FIG. 3 illustrates a cross-sectional view of a display device in accordance with some embodiments of the present disclosure.

Next, referring to FIG. 3, FIG. 3 illustrates a cross-sectional view of a display device 30 in accordance with some embodiments of the present disclosure. In the embodiment shown in FIG. 3, the first display structure 104 is a liquid-crystal display and the second display structure 106 is an organic light-emitting diode display. The difference between the embodiments shown in FIG. 3 and FIG. 1 is that the second display structure 106 is an organic light-emitting diode display in FIG. 3. Similarly, the display device 30 includes the sealing portion 128 disposed adjacent to the liquid-crystal layer 110. The sealing portion 128 at least partially overlaps the second substrate 114 in accordance with some embodiments.

Figure 4:
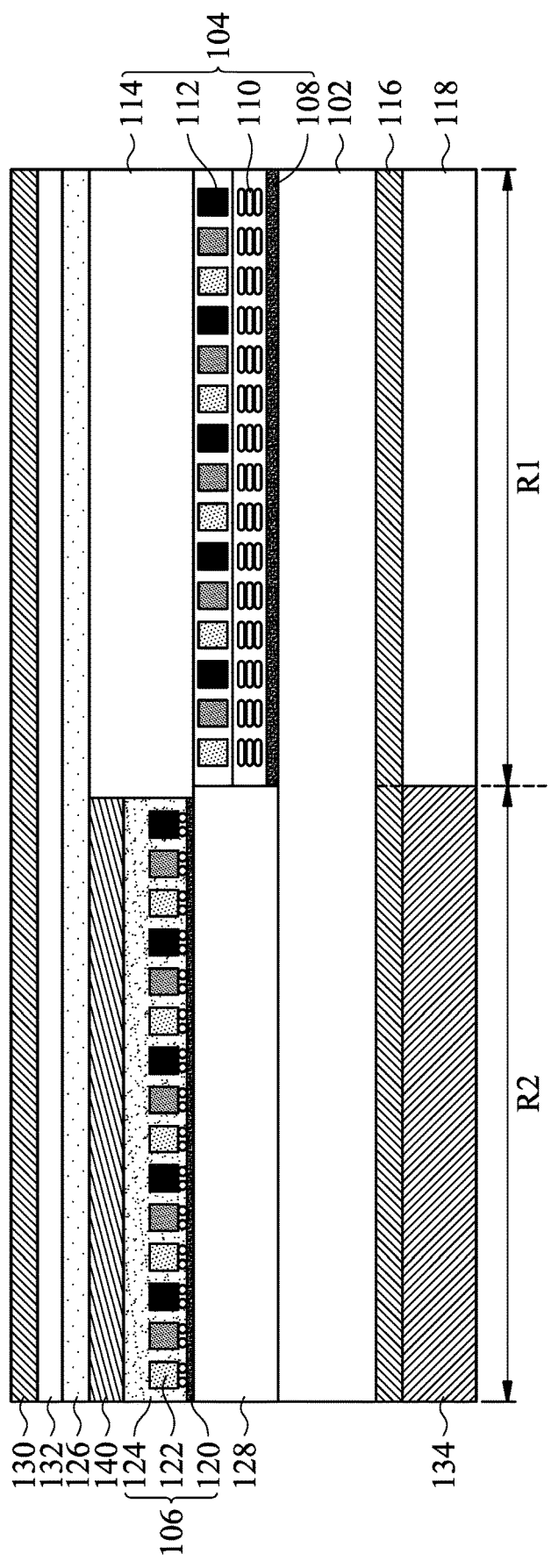
FIG. 4 illustrates a cross-sectional view of a display device in accordance with some other embodiments of the present disclosure.

In addition, in accordance with some embodiments of the present disclosure, the display device may include a retardation layer 140 disposed on the region where the organic light-emitting diode display, the inorganic light-emitting diode display, or the laser display is disposed. For example, FIG. 4 illustrates a cross-sectional view of a display device 40 in accordance with some other embodiments of the present disclosure. FIG. 4 differs from FIG. 1 in that a retardation layer 140 is disposed in the second region R2 corresponding to where the second display structure 106 (the inorganic light-emitting diode display) is located. Furthermore, the retardation layer 140 may be disposed at any position above the organic light-emitting diode display, the inorganic light-emitting diode display or the laser display. For example, the retardation layer 140 may be disposed between the protecting layer 126 and the first adhesive layer 132 (as shown in FIG. 2) in accordance with some embodiments. In some other embodiments, the retardation layer 140 may be disposed between the first encapsulation layer 124 and the protecting layer 126 (as shown in FIG. 4). In some embodiments, the top surface of the retardation layer 140 may be substantially level with the top surface of the second substrate 114.

It should be understood that although not all of the combinations of different types of display structures are illustrated in the figures, one with ordinary skill in the art can make suitable combinations or modifications to the display device according to need. In addition, although the laser display structure is not specifically illustrated in the figures, it has a structure that is substantially similar to the structure of the inorganic light-emitting diode display. Therefore, the hybrid structures of the laser display and other types of displays will be similar to those of the inorganic light-emitting diode and other types of displays.

Next, referring to FIGS. 5A-5E, FIGS. 5A-5E illustrate the cross-sectional views of the display device during the manufacturing process in accordance with some embodiments of the present disclosure. FIGS. 5A-5E illustrate some manufacturing processes of the display device 10 in FIG. 1 as an example. Other display devices provided in the present disclosure may be formed by similar or corresponding processes, as shown in FIGS. 5A-5E. It should be understood that additional operations may be provided before, during, and after the processes of the manufacturing process in accordance with some embodiments. In some other embodiments, some of the operations described below may be replaced or eliminated. In some embodiments, the order of the operations may be interchangeable.

Figure 5A:
Figure 5B:
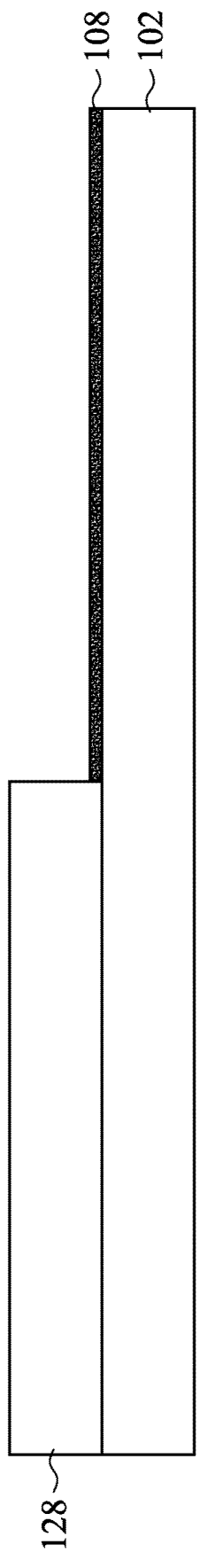
Figure 5C:
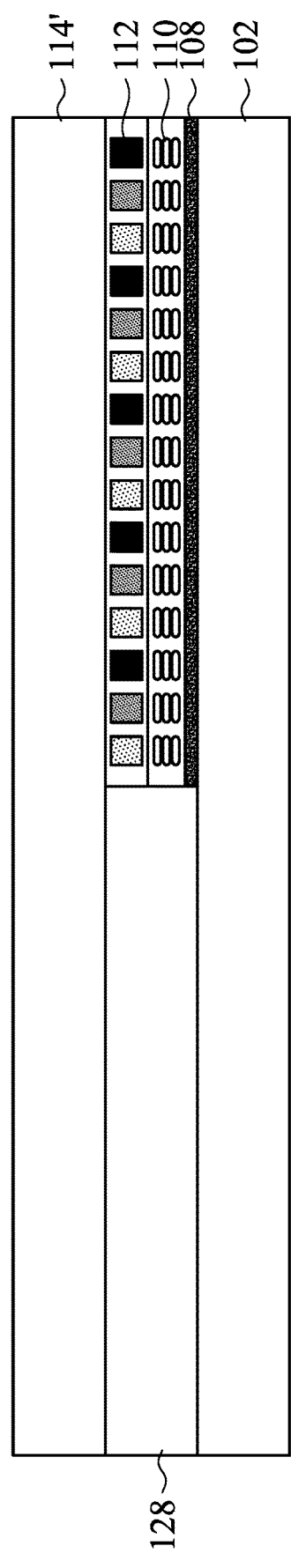

First, as shown in FIG. 5A, the first substrate 102 is provided. The first driving layer 108 is formed on the first side 102a of the first substrate 102. Next, referring to FIG. 5B, the sealing portion 128 is formed on the first side 102a of the first substrate 102 and adjacent to the first driving layer 108. The sealing portion 128 can be in contact with the first driving layer 108. Then, referring to FIG. 5C, the second substrate 114' on which the color filter layer 112 is formed is assembled with the first substrate 102 on which the first driving layer 108 is formed, and the liquid-crystal layer 110 is filled between the first substrate 102 and the second substrate 114'.

Next, referring to FIG. 5D, a portion of the second substrate 114' is removed so that a portion of the sealing portion 128 is exposed. However, in some embodiments, the sealing portion 128 still includes a portion 128A that overlaps the second substrate 114. In other words, the portion 128A of the sealing portion 128 is disposed between the first substrate 102 and the second substrate 114. Next, referring to FIG. 5E, the second driving layer 120, the first light-emitting layer 122, the first encapsulation layer 124 of the second display structure 106 are formed on the exposed region of the sealing portion 128, i.e. the region that is exposed by removal of the second substrate 114'. Then, the protecting layer 126 is formed on the first encapsulation layer 124 and the second substrate 114. In some embodiments, a planarization process can be performed on the protecting layer 126 so that the protecting layer has a substantially planarized top surface 126a. Thereafter, the polarizing structure 130 can be adhered to the protecting layer 126 by the first adhesive layer 132.

Figure 6A:
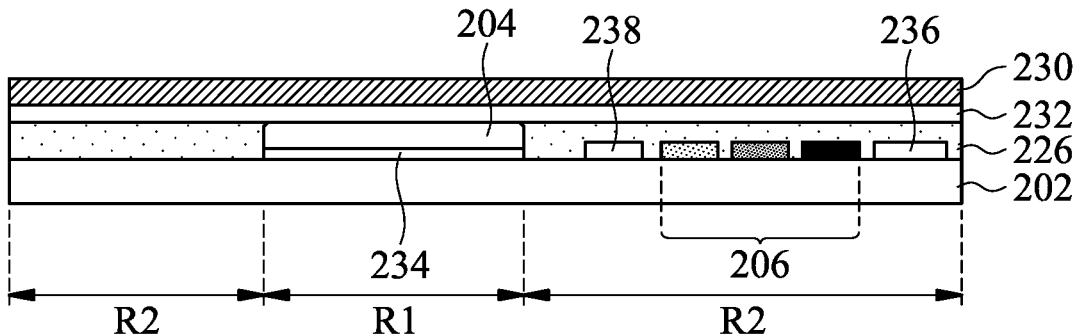
FIGS. 6A-6C illustrate the cross-sectional views of the display device in accordance with some embodiments of the present disclosure.
Figure 6B:
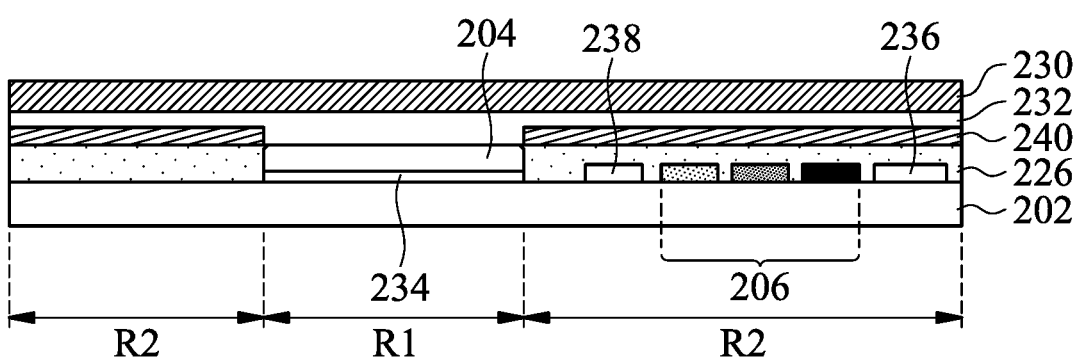
Figure 6C:
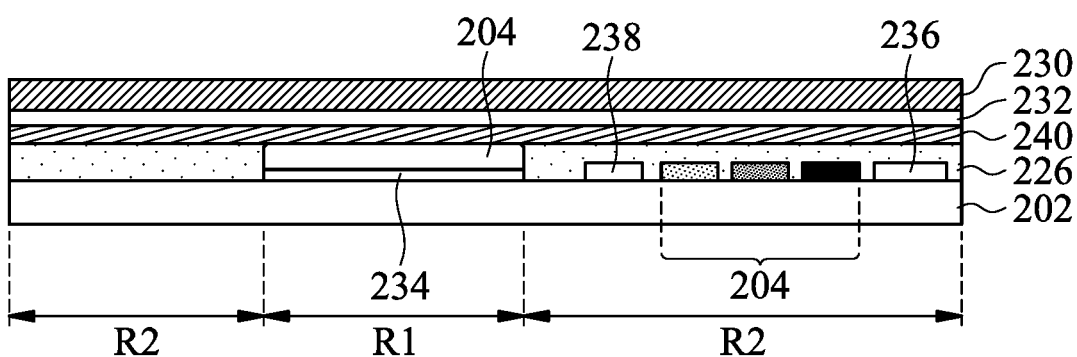

Next, referring to FIGS. 6A-6C, FIGS. 6A-6C illustrate the cross-sectional views of a display device 50 in accordance with some embodiments of the present disclosure. As shown in FIG. 6A, the display device 50 includes a first substrate 202, a first display structure 204 and a second display structure 206. The first display structure 204 is disposed on the first region R1 of the first substrate 202, and the second display structure 206 is disposed on the second region R2 of the first substrate 202. In some embodiments, the display device 50 may be a wearable display device, in which the first display structure 204 can serve as a watch portion, and the second display structure 206 can serve as a belt portion. The structure of the display device 50 is simplified in FIG. 6A to 6C for clarity. The structure of the display device 50 is similar to the structures of the above-mentioned display devices in FIG. 1 to FIG. 4, and the detailed descriptions are omitted herein. For example, in some embodiments, the first display device 204 is a liquid crystal display or an organic light-emitting diode display, and the second display device 206 is an inorganic light-emitting diode display or a laser display.

The first display structure 204 may be affixed on the first substrate 202 through the adhesive layer 234. In addition, the display device 50 may further include a controller 236 and a sensor 238 disposed on the first substrate 202. The controller 236 or the sensor 238 may be arranged adjacent to the second display structure 206. In some embodiments, the controller 236 may control and/or process the signals generated from the second display structure 206 or the sensor 238. In some embodiments, the sensor 238 may include, but is not limited to, a light sensing element, an infrared sensing element, a respiration sensing element, a heartbeat sensing element, a voice sensing element, a facial recognition element, a fingerprint sensing element, any other suitable sensing elements, or a combination thereof.

The display device 50 may further include a protecting layer 226 disposed on the second display structure 206. In some embodiments, the protecting layer 226 may also be disposed on the first display structure 204. The protecting layer 226 can be made of the materials suitable for forming the protecting layer 126 as mentioned above.

The display device 50 may further include a polarizing layer 230 disposed on the first display structure 204 and the second display structure 206, and can be adhered to the protecting layer 226 and the first display structure 204 by an adhesive layer 232.

Next, referring to FIG. 6B, FIG. 6B illustrates the cross-sectional view of the display device 50 in accordance with some other embodiments of the present disclosure. The difference between the embodiments shown in FIG. 6B and FIG. 6A is that the display device 50 further includes a retardation layer 240 disposed on the second display structure 206 in the second region R2. The retardation layer 240 can be disposed between the second display structure 206 and the first polarizing structure 230. In some embodiments, the retardation layer 240 can also extend to the first region R1 to be disposed on the first display structure 204, as shown in FIG. 6C.

Figure 7A:
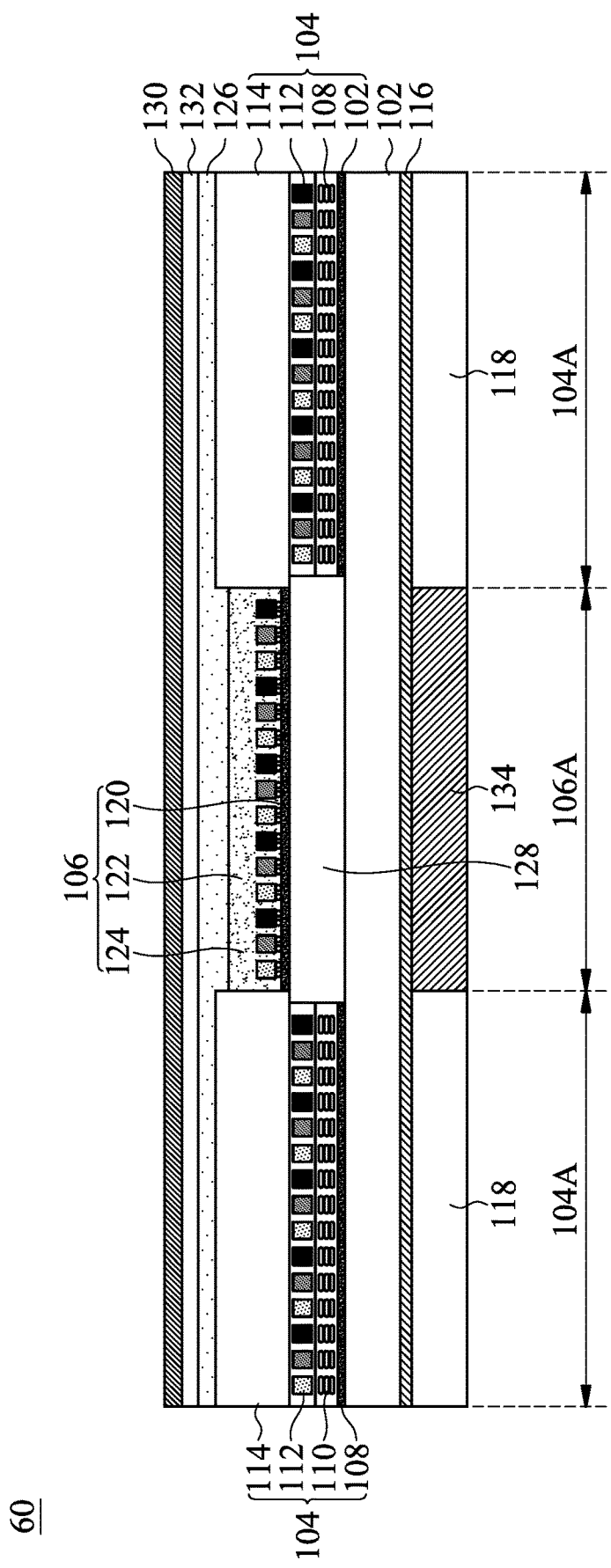
FIG. 7A illustrates a cross-sectional view of a display device in accordance with some embodiments of the present disclosure.

Next, referring to FIG. 7A, FIG. 7A illustrates a cross-sectional view of a display device 60 in accordance with some embodiments of the present disclosure. The display device 60 is similar as the display device 10 shown in FIG. 1, except that the display device 60 includes two first display structures 104, and a second display structure 106 is disposed between these two first display structures 104. In this embodiment, the first substrate 102 can be a flexible substrate. In this embodiment, a region 106A corresponding to the second display structure 106 may serve as a foldable region. In this embodiment, the second display structure 106 may include an organic light-emitting diode display, an inorganic light-emitting diode display, or a laser display, and the first display structure 104 may include a liquid-crystal display.

Figure 7B:
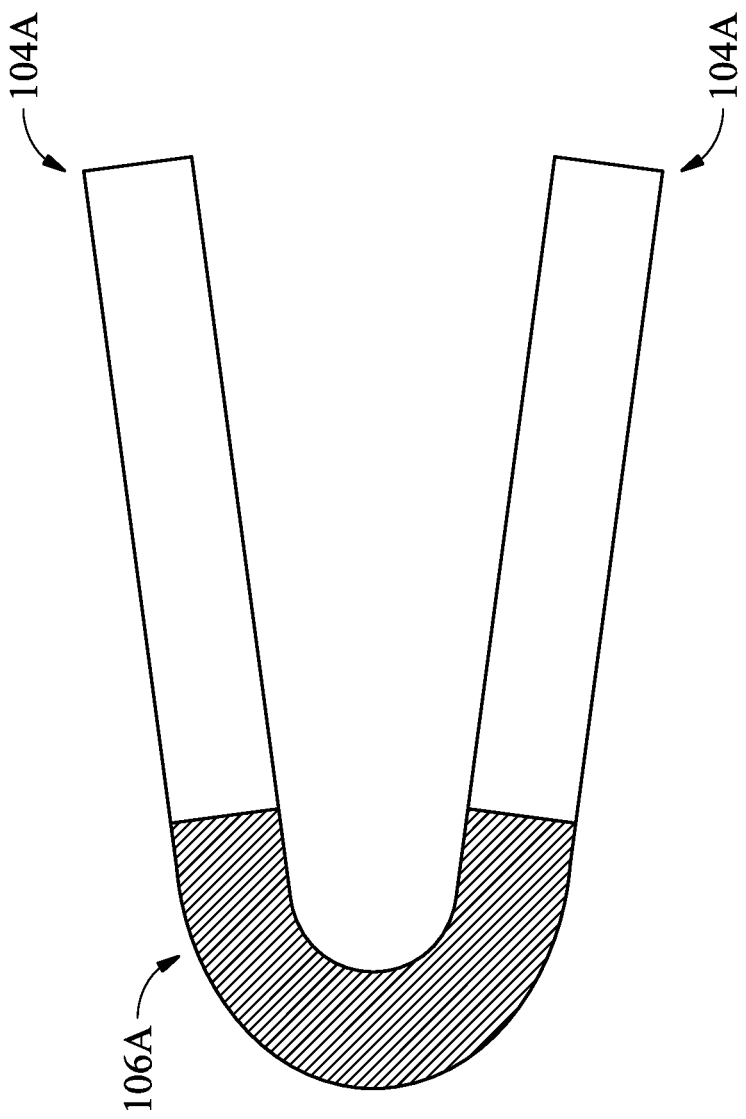
FIG. 7B illustrates a diagram of the display device in a folded form.

Referring to FIG. 7B, FIG. 7B illustrates a diagram of the display device 60 in a folded form. As shown in FIG. 7B, the region 106A corresponding to the second display structure 106 is bent (or folded), while the regions 104A corresponding to the first display structure 104 are not bent (or folded). However, it should be understood that although the display device 60 of the embodiment shown in FIG. 7A includes two unfoldable regions (region 104A) and one foldable region (region 106A), other amounts or combinations of the foldable region and unfoldable region may be applied according to the needs of some other embodiments.

Figure 8A:
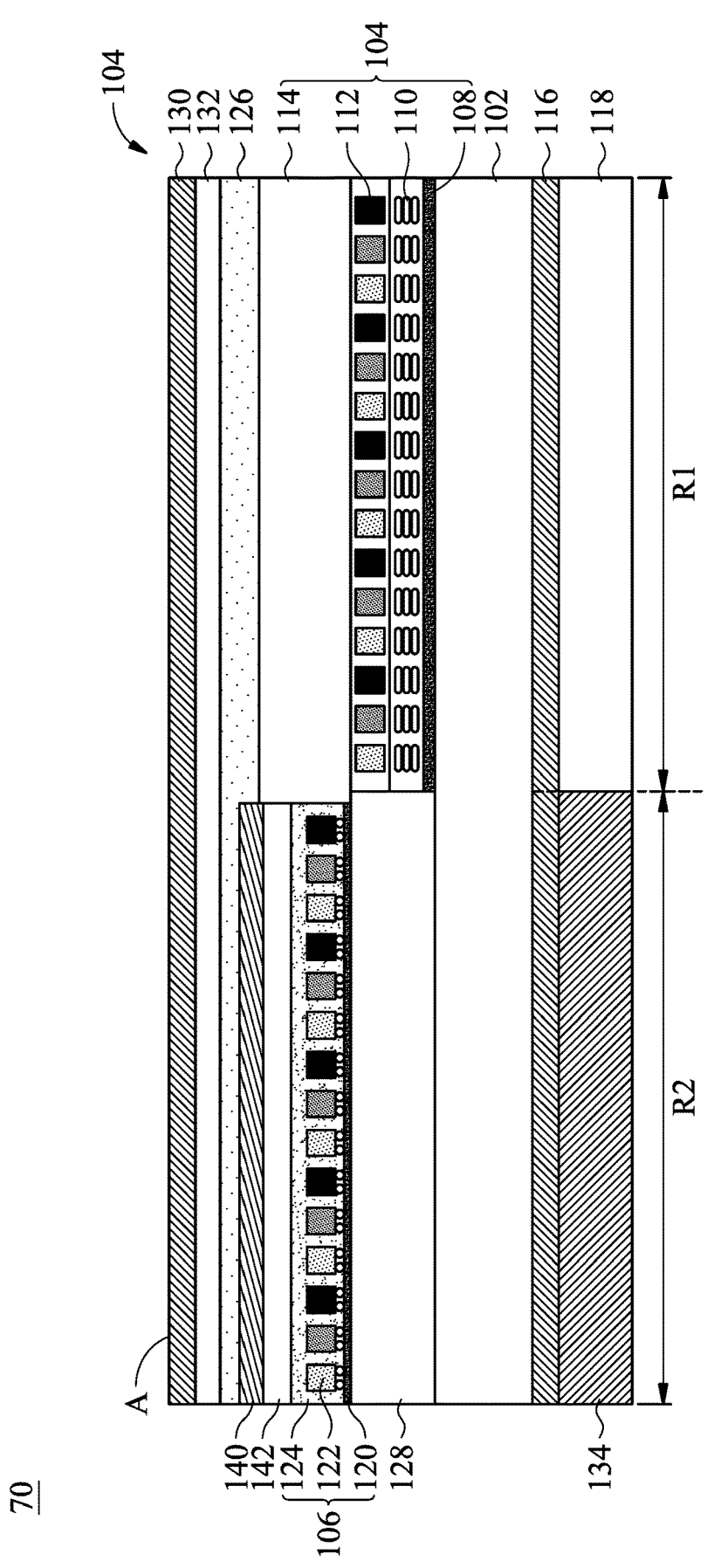
FIGS. 8A-8B illustrate the cross-sectional views of the display device in accordance with some embodiments of the present disclosure.
Figure 8B:
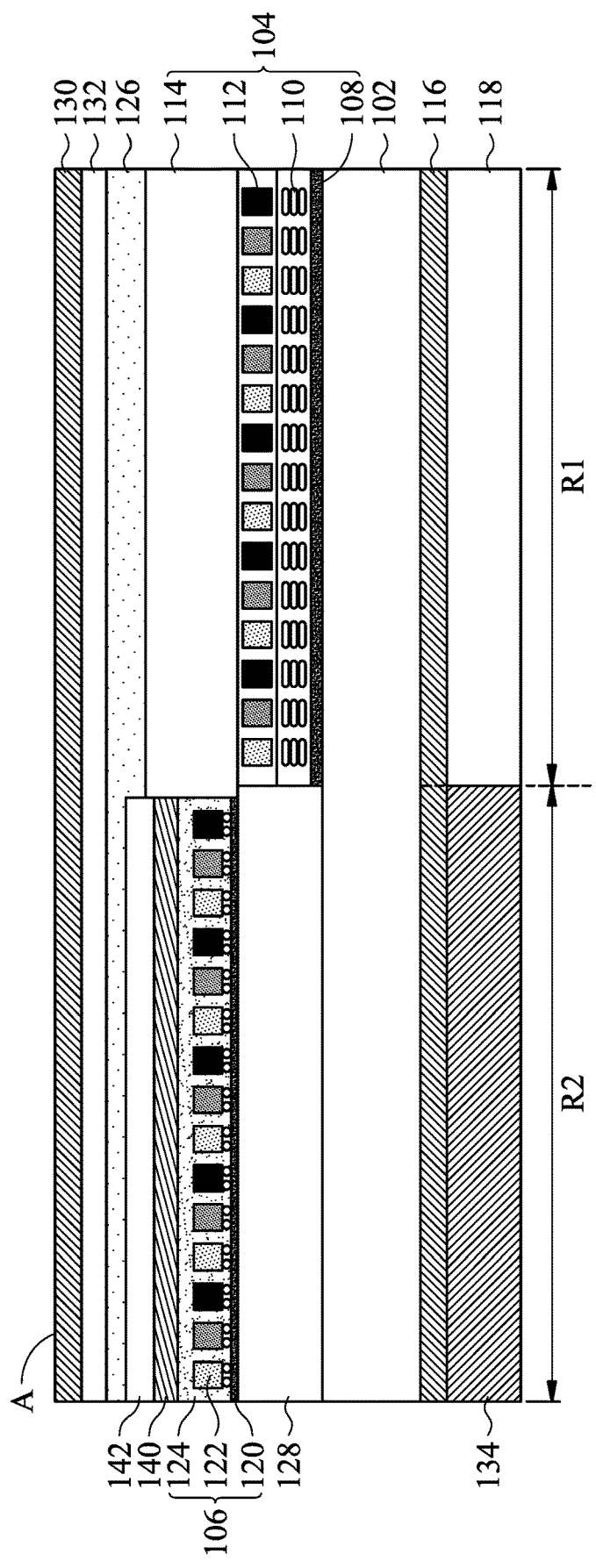

Next, referring to FIG. 8A, FIG. 8A illustrates a cross-sectional view of a display device 70 in accordance with some embodiments of the present disclosure. The difference between the display device 70 as shown in FIG. 8A and the display device 10 shown in FIG. 1 is that the display device 70 further includes the retardation layer 140 and a light reducing layer 142 disposed on the second display structure 106. As shown in FIG. 8A, the light reducing layer 142 can be disposed between the first encapsulation layer 124 and the retardation layer 140. Specifically, the light reducing layer 142 may be disposed on the region where the second display structure 106 is disposed. In addition, the light reducing layer 142 may be disposed at any position above the second display structure 106. For example, in some embodiments, the light reducing layer 142 can be disposed between the retardation layer 140 and the protecting layer 126, as shown in FIG. 8B. In some embodiments, the top surface of the retardation layer 140 may be substantially level with the top surface of the second substrate 114, and thus the protecting layer 126 may be omitted.

The light reducing layer 142 may partially shield the light emitted from the second display structure 106 (e.g., the light emitted from the first light-emitting layer 122) and reduce the light intensity thereof. Since the light source of the first display structure 104 (i.e. the backlight unit 118) is more distant from the light emergent surface A than the light source of the second display structure 106 (i.e. the first light-emitting layer 122), the light intensity of the images shown by the first display structure 104 and the second display structure 106 may be different. The light reducing layer 142 may reduce the light intensity of the second display structure 106 so that the images shown by the first display structure 104 and the second display structure 106 may be more consistent or uniform. In some embodiments, the light reducing layer 142 may decrease the light intensity of the second display structure 106 with a level of about 50% to about 95%.

The light reducing layer 142 may be made of materials having light-shielding characteristics. In some embodiments, the materials of the light reducing layer 142 may include, but are not limited to, silicone and the particles formed of carbon, titanium (Ti), titanium dioxides ($TiO_2$), quantum dot materials or a combination thereof. In some embodiments, the thickness of the light reducing layer 142 may be in a range from about 0.05 μm to about 10 μm. In some embodiments, the light reducing layer 142 may be formed by using chemical vapor deposition (CVD), spin-on coating or printing.

The light intensity of the second display structure 106 (the first light-emitting layer 122) may also be decreased by current adjustment through the second driving layer 120 or the panel driving portion 134 in accordance with some embodiments. Furthermore, in some embodiments, the color filter layer 112 of the first display structure 104 may be formed of quantum dot materials to further increase the light intensity of the first display structure 104. Specifically, in some embodiments, the light intensity of the backlight unit 118 and the light intensity of the second display structure 106 can be controlled, so as to obtain more uniform light intensity at the light emergent surface A. For example, the ratio of the light intensity of the backlight unit 118 to the light intensity of the second display structure 106 may be in a range from about 5 to about 30. The light intensity of the second display structure 106 may be the light intensity measured at the light emergent surface A corresponding to the region where the second display structure 106 is located. In addition, the light intensity may be measured by a spectroradiometer, for example, by Konica Minolta (CS2000/CS2000A).

Next, referring to FIG. 9, FIG. 9 illustrates a cross-sectional view of a display device 80 in accordance with some embodiments of the present disclosure. The difference between the display device 80 shown in FIG. 9 and the display device 40 shown in FIG. 1 is that the first polarizing structure 930 includes two separate polarizing layers 931 and 932, and a retardation layer 140 is disposed on the second display structure 106. The polarizing layer 931 is disposed on the first display structure 104 and adhered to the protecting layer 126 by an adhesive layer 951, and the polarizing layer 932 is disposed on the second display structure 106 and adhered to the protecting layer 126 by an adhesive layer 952. In addition, the top surface 932a of the polarizing layer 932 may be aligned with the top surface 931a of the polarizing layer 931 in accordance with some embodiments. In other words, the top surface 931a and the top surface 932a may be substantially planarized.

Figure 10:
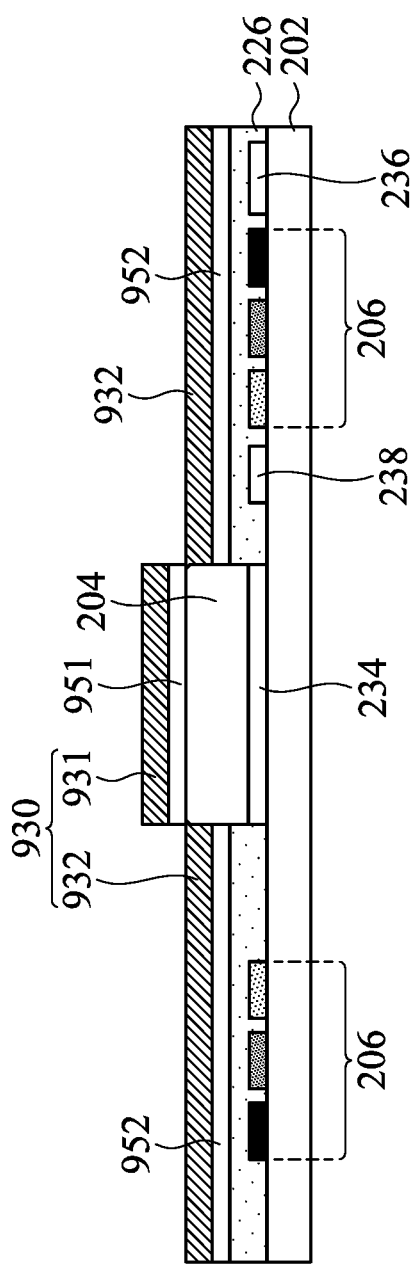
FIG. 10 illustrates a cross-sectional view of a display device in accordance with some other embodiments of the present disclosure.

Next, referring to FIG. 10, FIG. 10 illustrates a cross-sectional view of the display device 50 in accordance with some other embodiments of the present disclosure. The difference between the display device 50 shown in FIG. 10 and FIG. 6A is that in the display device 50 in FIG. 10, the first polarizing structure 930 includes two separate polarizing layers 931 and 932. The polarizing layer 931 is disposed on the first display structure 204 and adhered to the first display structure 204 by an adhesive layer 951, and the polarizing layer 932 is disposed on the second display structure 206 and adhered to the protecting layer 226 by an adhesive layer 952. In some embodiments, the first display structure 204 can be a liquid-crystal display and can have a greater thickness than the second display structure 206. In such cases, it may have difficult to adhere one polarizing layer on both the first display structure 204 and the second display structure 206 because of the difference in thickness. In some embodiments, two separate polarizing layers 931 and 932 can be adhered to the first display structure 204 and the second display structure 206 respectively even if the thickness in difference exists.

Figure 11:
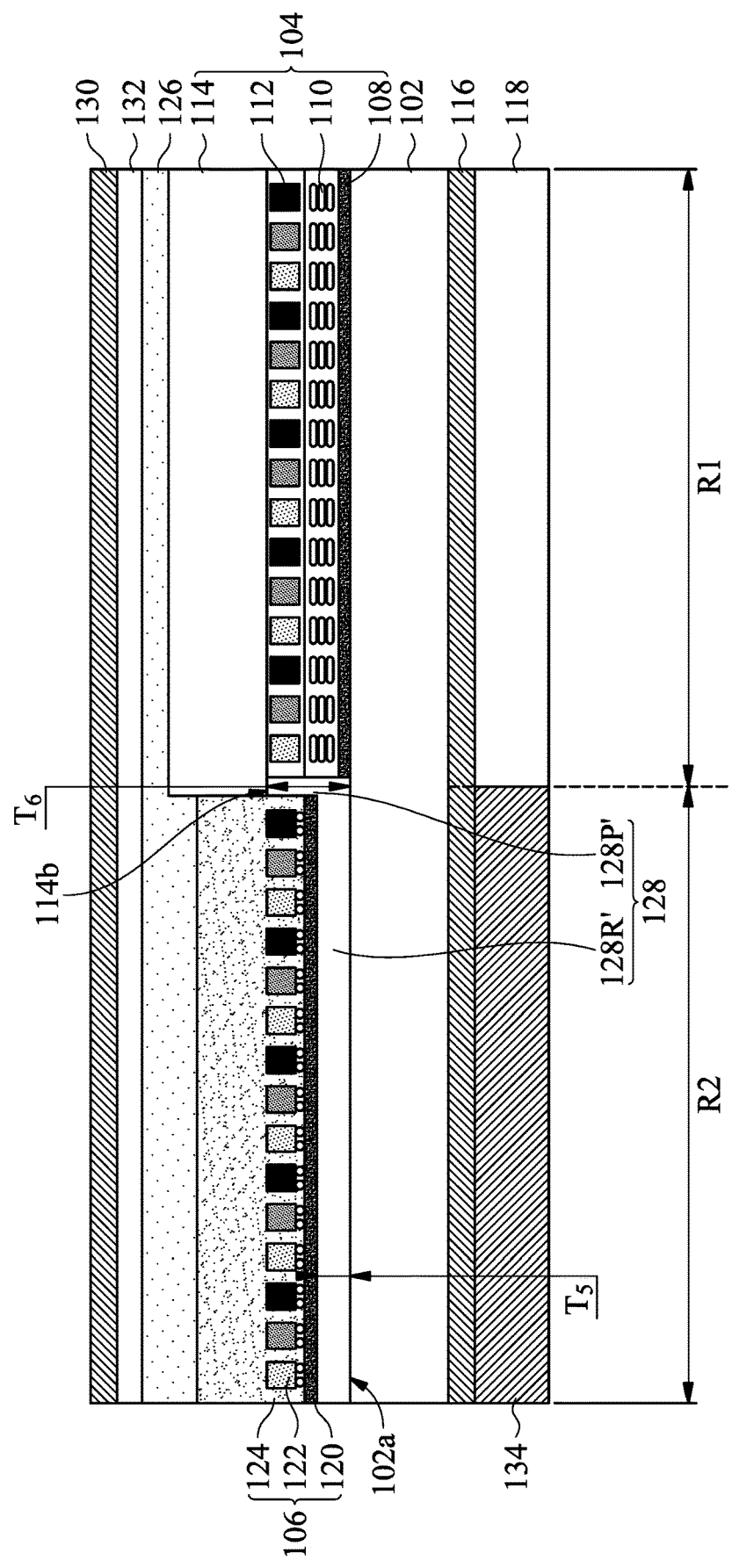
FIG. 11 illustrates a cross-sectional view of a display device in accordance with some other embodiments of the present disclosure.

Next, referring to FIG. 11, FIG. 11 illustrates a cross-sectional view of the display device 90 in accordance with some other embodiments of the present disclosure. The display device 90 is similar as the display device 10 shown in FIG. 1. The difference between the display device 90 shown in FIG. 10 and the display device 10 shown in FIG. 1 is the structure of the sealing portion. In some embodiments, a portion of the sealing portion can be removed, for example, by photolithography, to form an opening. Thus, the remained sealing portion 128 is defined as the protruding portion 128P' and the portion corresponding to the opening, which is defined as the recess portion 128R'. From a top view perspective, the protruding portion 128P' can be disposed between the first display structure 104 and the second display structure 106. From a cross-sectional view perspective, the second display structure 106 is disposed on the recess portion 128R'. The protruding portion 128P' protrudes from the first side 102a of the first substrate 102 toward the second side 114b of the second substrate 114, and can be disposed between the first substrate 102 and the second substrate 114. In some embodiments, the protruding portion 128P' of the sealing portion 128 is disposed between the first light-emitting layer 122 of the second display structure 106 and the liquid-crystal layer 108 of the first display structure 104. The recess portion 128R' of the sealing portion 128 may have a fifth thickness $T_5$, and the protruding portion 128P' of the sealing portion 128 may have a sixth thickness $T_6$. In some embodiments, the fifth thickness $T_5$ is smaller than the sixth thickness $T_6$.

Figure 12:
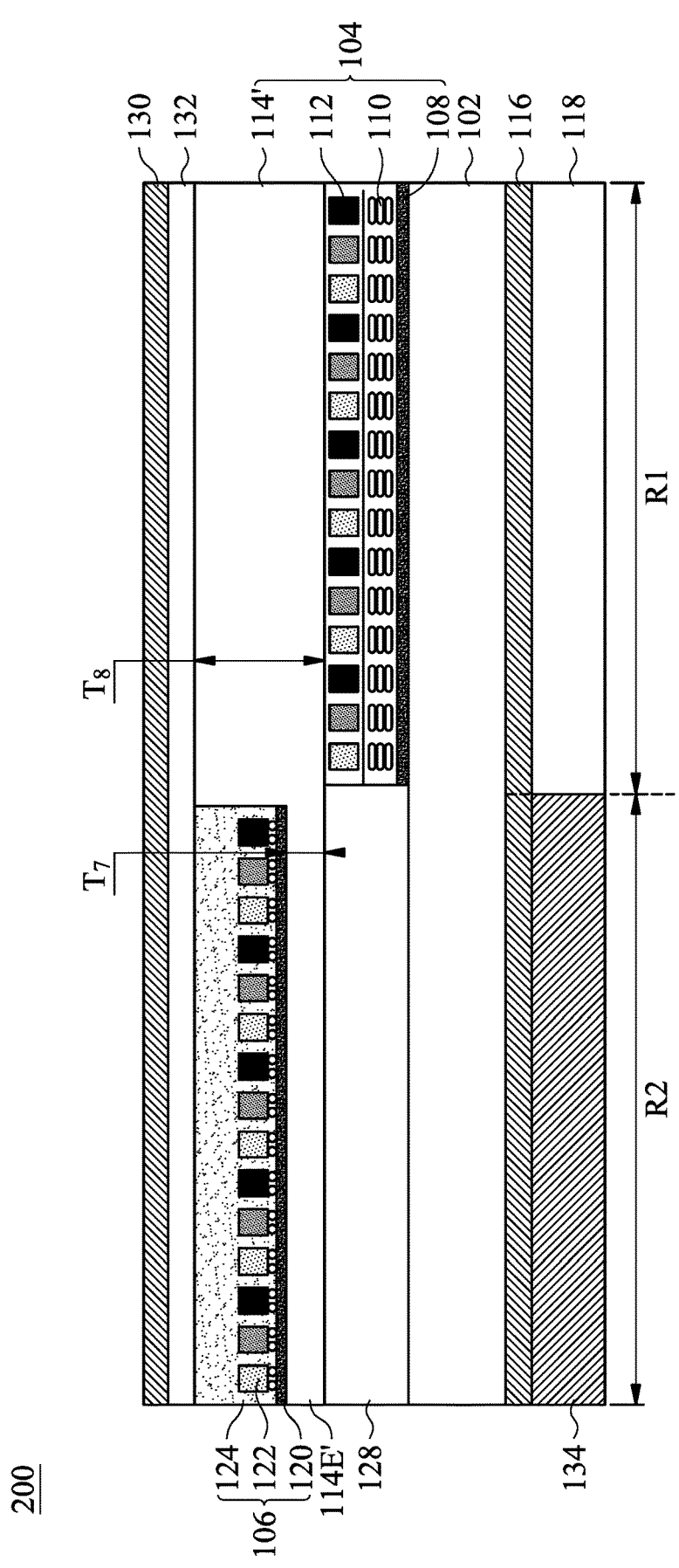
FIG. 12 illustrates a cross-sectional view of a display device in accordance with some other embodiments of the present disclosure.

Next, referring to FIG. 12, FIG. 12 illustrates a cross-sectional view of the display device 200 in accordance with some other embodiments of the present disclosure. The difference between the display device 200 shown in FIG. 12 and the display device 10 shown in FIG. 1 is that the second substrate 114' includes an extending portion 114E'. In some embodiments, a portion of the second substrate 114' can be removed, for example, by photolithography, to form an opening. The portion corresponding to the opening is defined as extending portion 114E'. The extending portion 114E' extends from the first display structure 104 to the second display structure 106. The extending portion 114E' is disposed between the sealing portion 128 and the second display structure 106. Specifically, the second driving layer 120, the first light-emitting layer 122 and first encapsulation layer 124 are disposed on the extending portion 114E'. In such a configuration, the second substrate 114' may be connected to other adjacent components in a seamless way. Moreover, the extending portion 114E' of the second substrate 114' may have a seventh thickness $T_7$, and the second substrate 114' may have an eighth thickness $T_8$. In some embodiments, the seventh thickness $T_7$ is smaller than the eighth thickness $T_8$.

Figure 13:
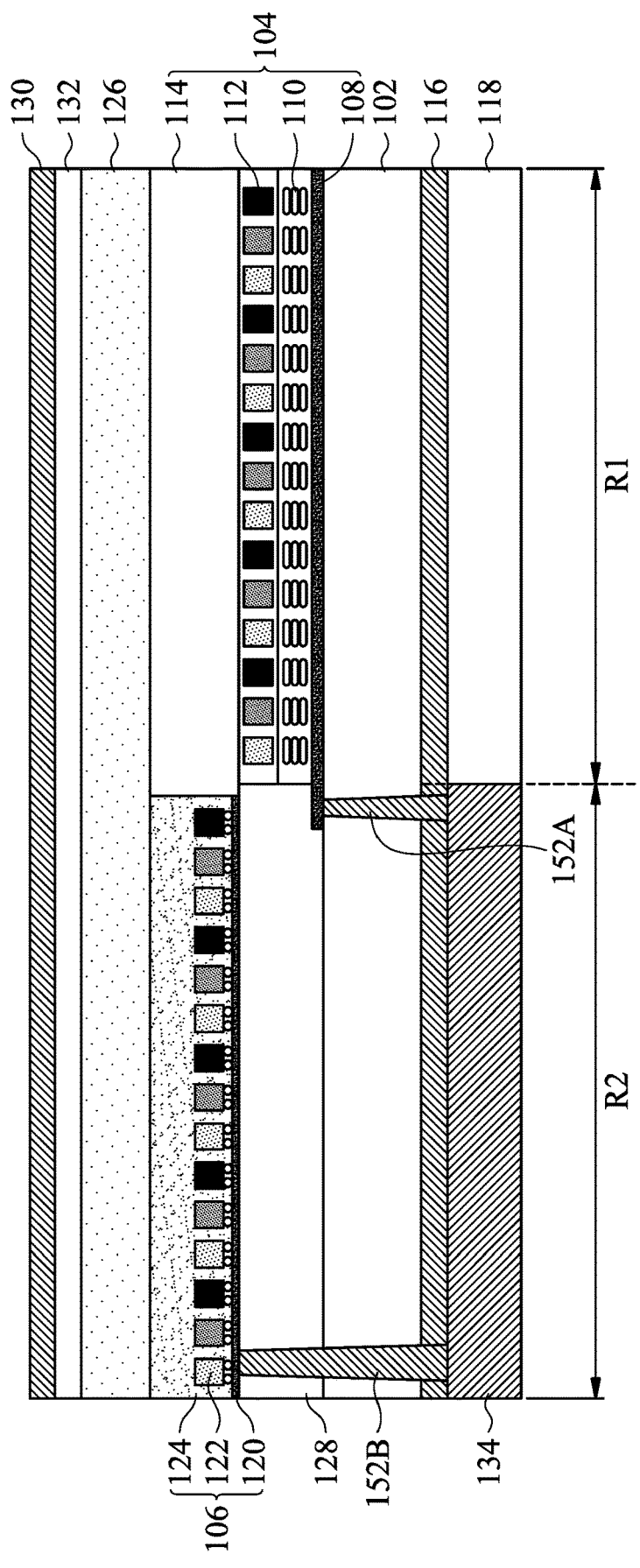
FIG. 13 illustrates a cross-sectional view of a display device in accordance with some embodiments of the present disclosure.

Next, referring to FIG. 13, FIG. 13 illustrates a cross-sectional view of the display device 300 in accordance with some embodiments of the present disclosure. As shown in FIG. 13, the first driving layer 108 and the second driving layer 120 may be electrically connected to the panel driving portion 134 by a via 152A and a via 152B in accordance with some embodiments. The via 152A and the via 152B may be formed of conductive materials. The conductive material can include, but is not limited to, copper, aluminum, tungsten, titanium, gold, platinum, nickel, copper alloys, aluminum alloys, tungsten alloys, titanium alloys, gold alloys, platinum alloys, nickel alloys, any other suitable conductive materials, or a combination thereof. In some embodiments, an opening may be formed in the first substrate 102, and the above conductive material can be filled in the opening to form the via 152A. An opening can be formed in the sealing portion 128 and the first substrate 102, and the above conductive material can be filled in the opening to form the via 152B.

Figure 14A:
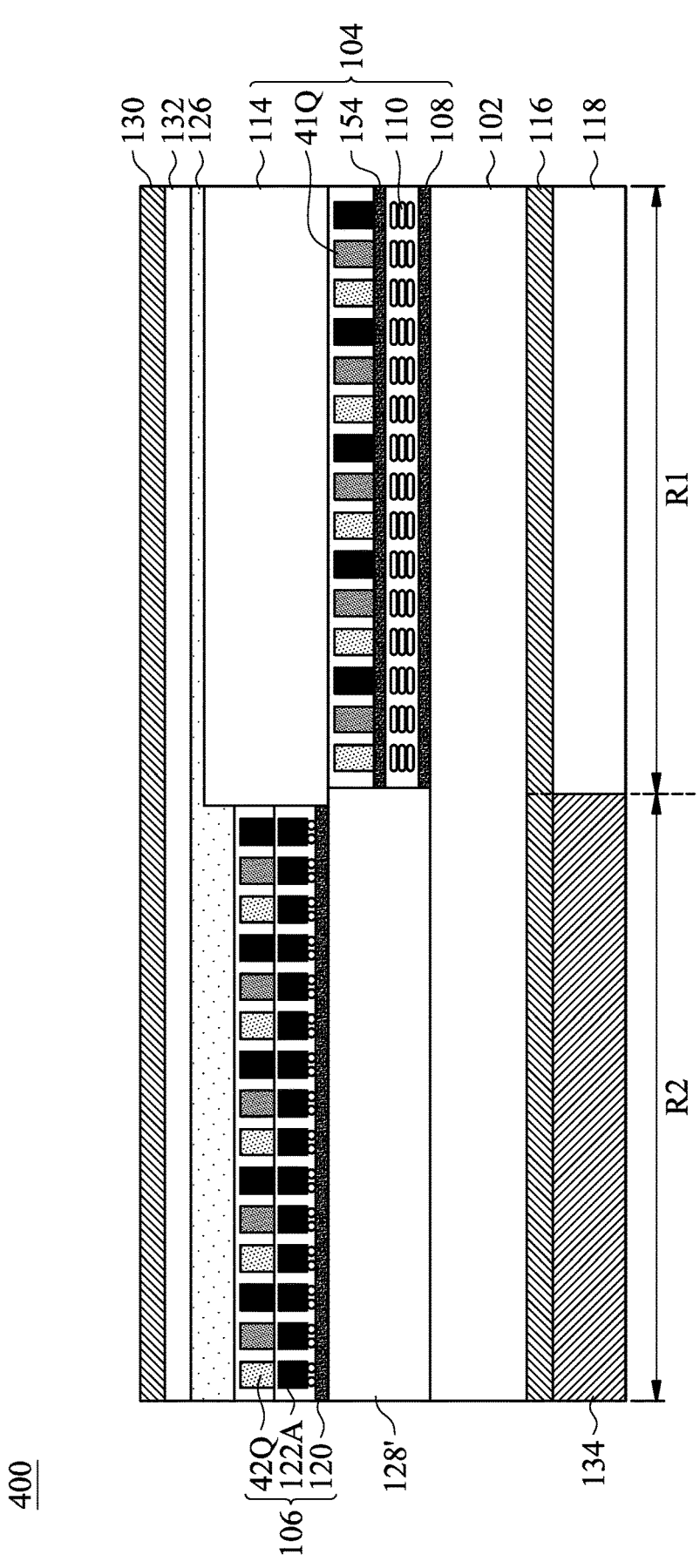
FIGS. 14A-14B illustrate the cross-sectional views of the display device in accordance with some embodiments of the present disclosure.

Next, referring to FIG. 14A, FIG. 14A illustrates a cross-sectional view of the display device 400 in accordance with some embodiments of the present disclosure. The difference between the display device 400 shown in FIG. 14A and the display device 10 shown in FIG. 1 is that the designs of the display structures and backlight sources are different. As shown in FIG. 14A, a wire-grid polarizer 154 and a first wavelength conversion layer 41Q are disposed in the first display structure 104. For example, the wire-grid polarizer 154 and the first wavelength conversion layer 41Q are disposed on the second substrate 114, and then the second substrate 114 and the first substrate 102 can be assembled to form the first display structure 104. The first wavelength conversion layer 41Q can be disposed between the wire-grid polarizer 154 and the second substrate 114. In the second display structure 106, the first light-emitting layer 122A can include light emitting diodes of a single color (for example, blue light emitting diodes), and a second wavelength conversion layer 42Q is disposed on the first light-emitting layer 122A. In some embodiments, the backlight unit 118 and the first light-emitting layer 122A may emit the light with a wavelength of about 350 nm to about 450 nm. For example, the backlight unit 118 and the first light-emitting layer 122A may emit UV light in accordance with some embodiments. In some embodiments, the backlight unit 118 and the first light-emitting layer 122A may emit the light of blue color.

The wire-grid polarizer 154 may be formed of metallic materials. In some embodiments, the metallic materials may include, but are not limited to, copper, aluminum, tungsten, titanium, gold, platinum, nickel, cobalt, chrome, silver, copper alloys, aluminum alloys, tungsten alloys, titanium alloys, gold alloys, platinum alloys, nickel alloys, cobalt alloys, chrome alloys, silver alloys, any other suitable conductive materials, or a combination thereof.

In this embodiment, the first wavelength conversion layer 41Q and the second wavelength conversion layer 42Q may be formed of quantum dot materials. The quantum dot material may have a core-shell structure. The core structure may include, but is not limited to, CdSe, CdTe, CdS, ZnS, ZnSe, ZnO, ZnTe, InAs, InP, GaP, or any other suitable materials, or a combination thereof. The shell structure may include, but is not limited to, ZnS, ZnSe, GaN, GaP, or any other suitable materials, or a combination thereof. In addition, as described above, the backlight unit 118 may emit UV light and the quantum dot material of the first wavelength conversion layer 41Q may be excited to generate red light, green light or blue light in accordance with some embodiments. Similarly, the first light-emitting layer 122A may emit UV light and the quantum dot material of the second wavelength conversion layer 42Q may be excited to generate red light, green light or blue light in accordance with some embodiments.

Figure 14B:
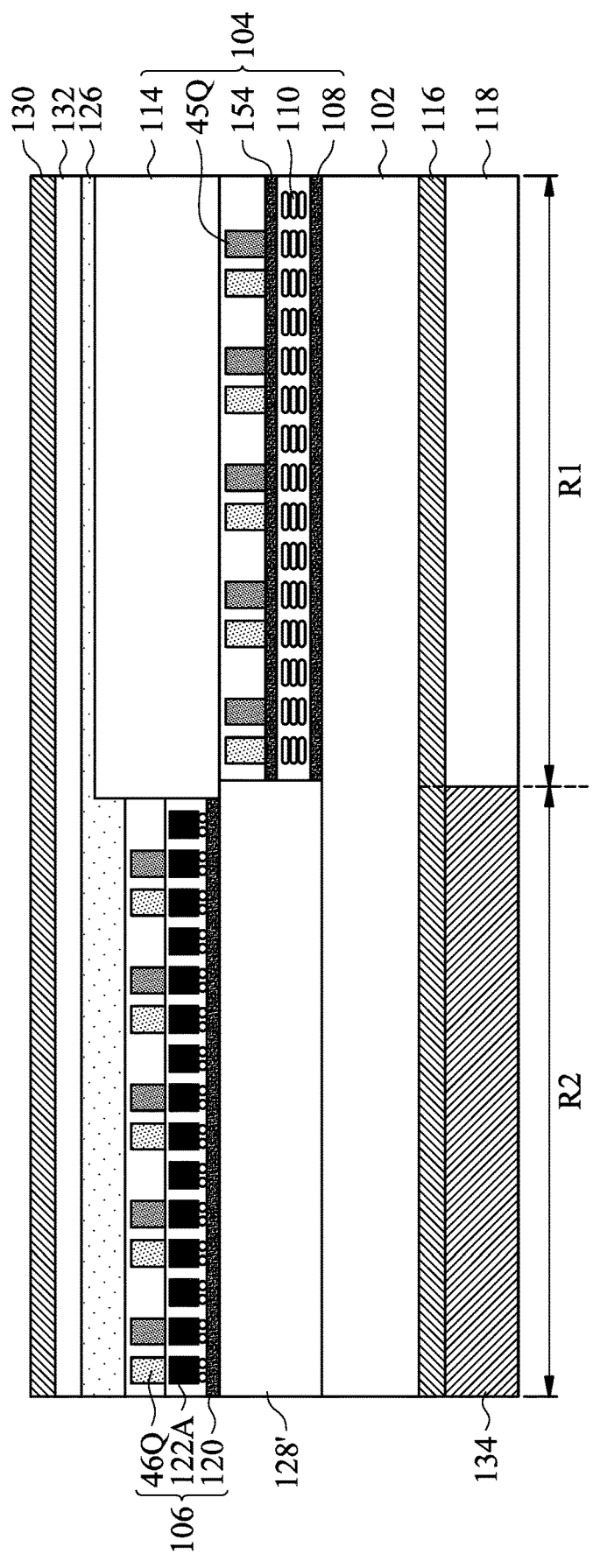

Next, referring to FIG. 14B, FIG. 14B illustrates a cross-sectional view of the display device 400 in accordance with some other embodiments of the present disclosure. The display device 400 shown in FIG. 14B is similar as that shown in FIG. 14A. FIG. 14B differs from FIG. 14A in that the first wavelength conversion layer 45Q and the second wavelength conversion layer 46Q do not include the material for converting blue light. The backlight unit 118 and the first light-emitting layer 122A can emit blue light, for example, emit the light with a wavelength of about 450 nm to about 495 nm. Thus, the light output of the backlight unit 118 and the first light-emitting layer 122A can also include red, green, and blue lights.

Figure 15:
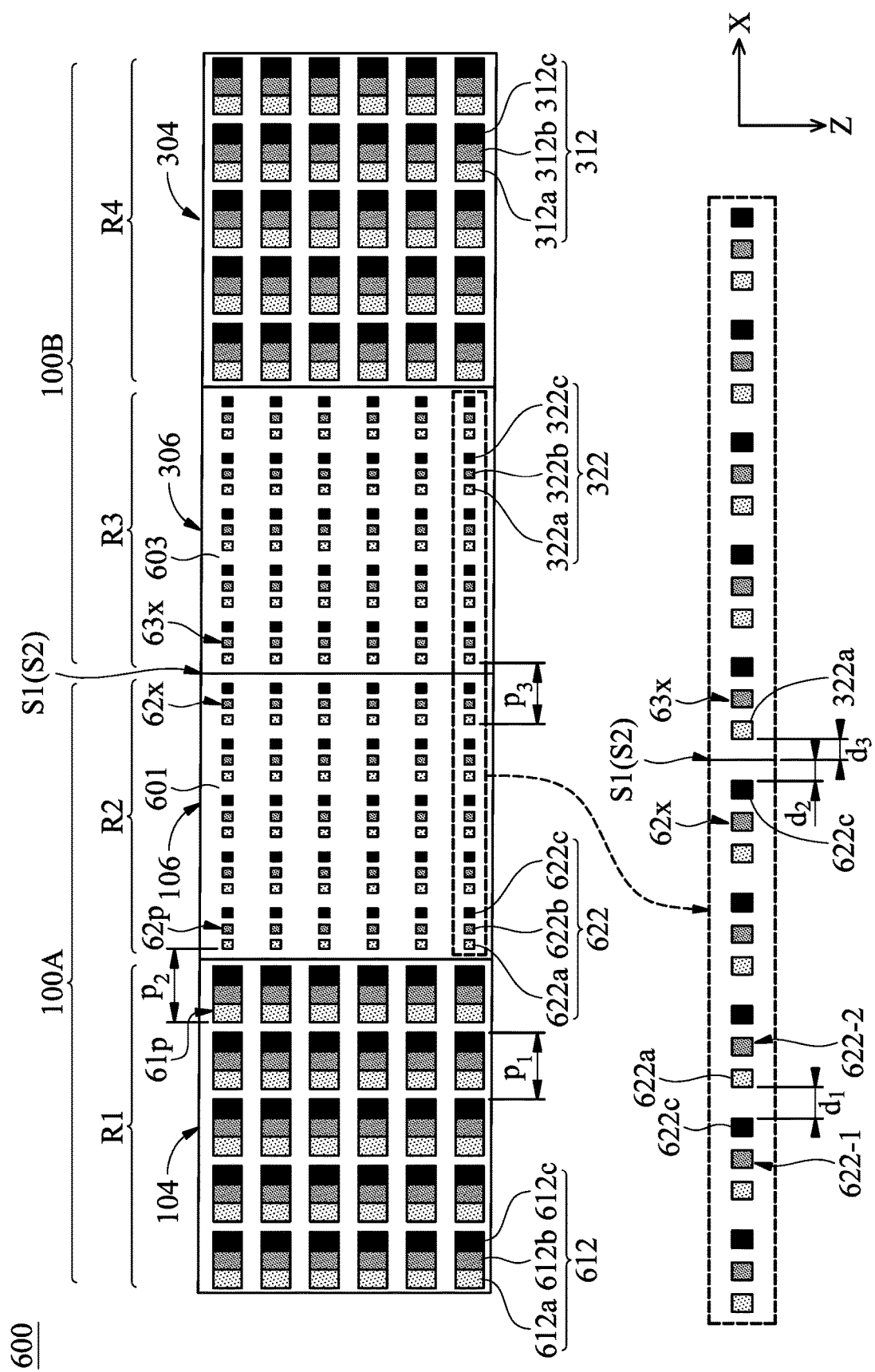
FIG. 15 illustrates a diagram showing the pixels of the display units in a display device in accordance with some embodiments of the present disclosure.

Next, referring to FIG. 15, FIG. 15 illustrates a diagram showing the pixels of the display units in a display device 600 in accordance with some embodiments of the present disclosure. The display device 600 may include two display units, a first display unit 100A and a second display unit 100B, connected to each other. For example, the display unit 100A and the display unit 100B may be connected by mechanical elements (not shown). Specifically, the second display unit 100B is connected to the first display unit 100A along a first direction (X direction) in a side-by-side manner. In some embodiments, the display device 600 may be a tiled (mosaic) display device including more than one display units. The display unit 100A and the display unit 100B may have similar structures as any display device described above. For example, the first display unit 100A may include a first substrate 601, a first display structure 104, and a second display structure 106. The first display structure 104 can be disposed on a first region R1 of the first substrate 601, and the second display structure 106 can be disposed on a second region R2 of the first substrate 601. In addition, the second display unit 100B may include a third substrate 603, a third display structure 306, and a fourth display structure 304. The third display structure 306 can be disposed on a third region R3 of the third substrate 603, and the fourth display structure 304 can be disposed on a fourth region R4 of the third substrate 603. In some embodiments, the second display structure 106 and the third display structure 306 can be formed of the same type of display. For example, both of the second display structure 106 and the third display structure 306 can be organic light-emitting diode displays, inorganic light-emitting diode displays, or laser displays.

The first display structure 104 and the second display structure 106 may include a plurality of first pixels 612 and a plurality of second pixels 622 respectively. Similarly, the third display structure 306 and the fourth display structure 304 may include a plurality of third pixels 322 and a plurality of fourth pixels 312 respectively.

In addition, each of the first pixel 612 may include first subpixels 612a, 612b and 612c. Each of the second pixel 622 may include second subpixels 622a, 622b and 622c. In some embodiments, the first pixels 612 have a first pitch $p_1$. The first pitch $p_1$ may be defined as a distance between a first subpixel 612a and the next (the closest) first subpixel 612a, or a distance between a first subpixel 612b and the next (the closest) first subpixel 612b, or a distance between a first subpixel 612c and the next (the closest) first subpixel 612c. In one first pixel 612, the three subpixel 612a, 612b, and 612c can emit lights of different colors. In one second pixel 622, the three subpixel 622a, 622b, and 622c can emit lights of different colors. In some embodiments, the two adjacent first pixel and second pixel define a second pitch $p_2$. Specifically, as shown in FIG. 15, the first pixel 61p of the first display structure 104 and the second pixel 62p of the second display structure 106 are adjacent to each other, and the distance between the first pixel 61p and the second pixel 62p defines the second pitch $p_2$. In some embodiments, a ratio of the first pitch $p_1$ to the second pitch $p_2$ ranges from 0.8 to 1.2. In such an arrangement, the images difference between the first display structure 104 and the second display structure 106 may be reduced.

In addition, each of the third pixel 322 may include third subpixels 322a, 322b and 322c, which can emit lights of different colors. Each of the fourth pixel 312 may include fourth subpixels 312a, 312b and 312c, which can emit lights of different colors. In some embodiments, the two adjacent second pixel and third pixel define a third pitch $p_3$. Specifically, as shown in FIG. 15, the second pixel 62x of the second display structure 106 and the third pixel 63x of the third display structure 306 are adjacent to each other, and the distance between the second pixel 62x and the third pixel 63x defines the third pitch $p_3$. In some embodiments, a ratio of the first pitch $p_1$ to the third pitch $p_3$ ranges from 0.8 to 1.2. In such an arrangement, the images difference between the display unit 100A and display unit 100B may be reduced.

In addition, as shown in FIG. 15, in the second display structure 106, the two adjacent second pixels 622 are spaced apart from each other by a first distance $d_1$ in accordance with some embodiments. Specifically, referring to the two adjacent second pixel 622-1 and second pixel 622-2, the third subpixel 622c in the pixel 622-1 and the first subpixel 622a in the pixel 622-2 are spaced apart from each other by the first distance $d_1$. In some embodiments, the first distance $d_1$ may also be defined as the closest distance between two second pixels 622.

Moreover, in some embodiments, by using the mechanical elements (not shown) for connection, the first substrate 601 of the first display unit 100A and the third substrate 603 of the second display unit 100B can be designed to be very close to each other. In other words, the side S1 of the first substrate 601 and the side S2 of the third substrate 603 can be very close to each other. In some embodiments, a distance between the second subpixel of the second display structure 106 nearest to the first connecting side S1 of the first substrate 601 defines a second distance $d_2$. Specifically, a distance between the second subpixel 622c of the second pixel 62x nearest to the first connecting side S1 defines the second distance $d_2$. In addition, a distance between the third subpixel of the third display structure 306 nearest to the second connecting side S2 of the third substrate 603 defines a third distance $d_3$. Specifically, a distance between the third subpixel 322a of the third pixel 63x nearest to the second connecting side S2 of the third substrate 603 defines the third distance $d_3$. In some embodiments, a ratio of the first distance $d_1$ to the sum of the second distance $d_2$ and the third distance $d_3$ ranges from 0.8 to 1.2. In such an arrangement, the images difference between the display unit 100A and display unit 100B may be reduced.

Figure 16:
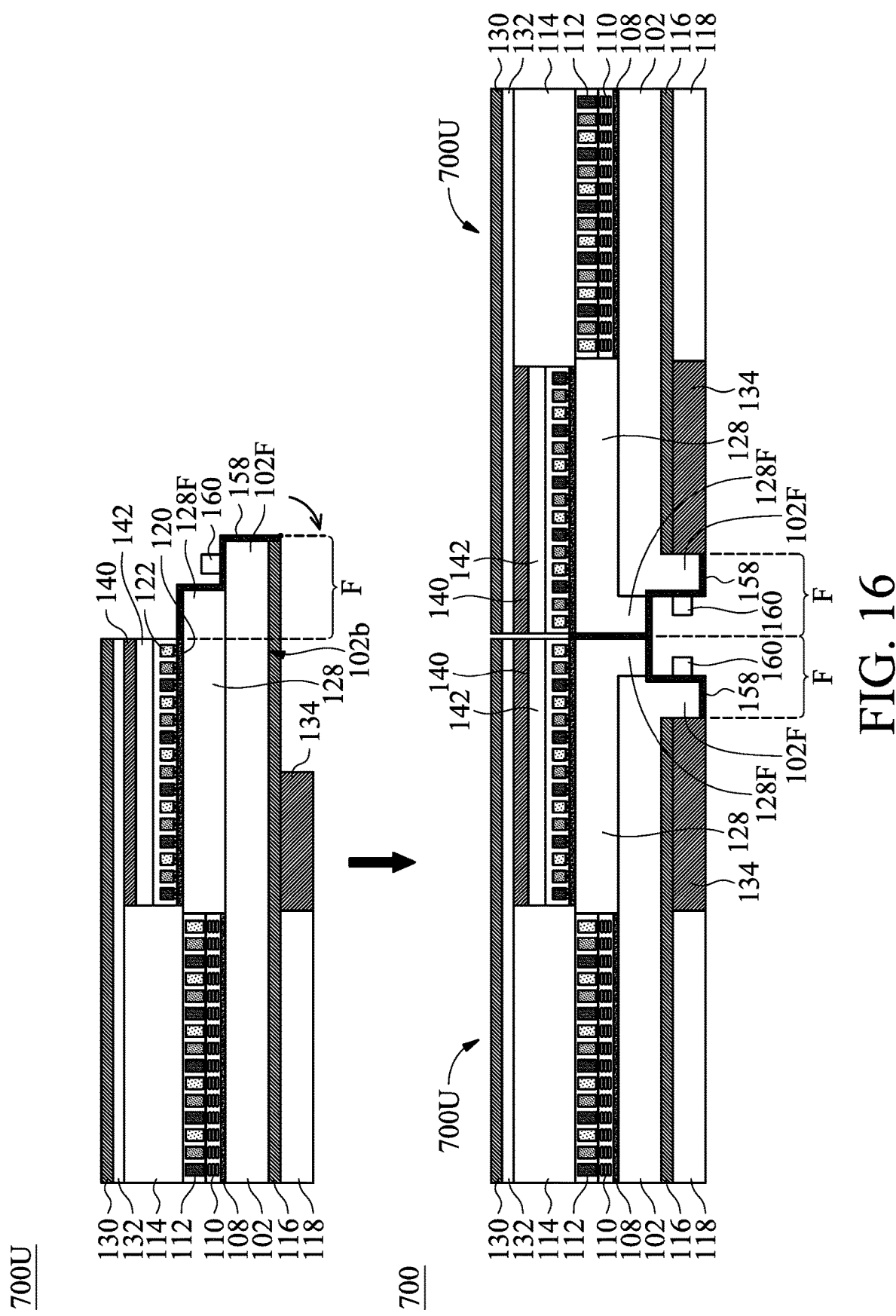
FIG. 16 illustrates a diagram showing the assembly of the display units in accordance with some embodiments of the present disclosure.

Next, referring to FIG. 16, FIG. 16 illustrates a diagram showing the assembly of the display units 700U in accordance with some embodiments of the present disclosure. As shown in FIG. 16, the display unit 700U may have similar structure as the display device 70 shown in FIG. 8A. However, it should be understood that although the display unit 700U has a similar structure as the display device 70 shown in FIG. 8A, the display unit 700U may have similar structures as any display device described above in some other embodiments. The difference between the display device 70 as shown in FIG. 8A and the display unit 700U shown in FIG. 16 is that the display unit 700U further includes a flexible region F disposed at an end of the display unit 700U. Specifically, the flexible region F includes a first flexible portion 102F at an end of the first substrate 102 and a second flexible portion 128F at an end of the sealing portion 128. The sealing portion 128 may protrude from the sidewall of the second display structure 106 and form the second flexible portion 128F. The first substrate 102 may also protrude from the sidewall of the second display structure 106 and form the first flexible portion 102F. In some embodiments, an area of the first flexible portion 102F is greater than an area of the second flexible portion 128F. In other words, the first substrate 102 may protrude farther away from the sidewall of the second display structure 106 than the sealing portion 128 protrudes, so that a step-like structure may be formed. In some embodiments, a signal circuit 158 may be disposed along the step-like structure of the first flexible portion 102F and the second flexible portion 128F and provide an electrical connection between the second driving layer 120 and the panel driving portion 134. In some embodiments, the electronic circuit 158 may include, but is not limited to, an integrated circuit (IC), a microchip, any other suitable electronic elements, or a combination thereof.

As shown in FIG. 16, the flexible region F may be bent downwardly to be on the second side 102b (backside) of the first substrate 102 to form a folded structure. In some embodiments, at least two display units 700U can be connected to each other to form a display device 700. Since a portion of the sealing portion 128 and a portion of the first substrate 102 are folded downwardly to the backside, the display units 700U can be assembled together in a closer manner. With such a configuration, the display units 700 may be connected even in a seamless way.

To summarize the above, the display device provided in the present disclosure includes different display structures disposed on the same substrate. A polarizing structure is disposed on the different types of display structures, so that heterogeneity between the images generated by different types of display structures may be reduced. The quality and uniformity of the image that are displayed may be improved accordingly. In addition, in accordance with some embodiments of the present disclosure, the display device can be a tiled display device including a first display unit and a second display unit. In accordance with some embodiments of the present disclosure, the pixel pitch and the distance between pixels are arranged in a specific manner so that the image difference at the boundary of the tiled display device may be reduced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
a first display unit, comprising:
a first substrate;
a first display structure disposed on the first substrate;
a second display structure disposed on the first substrate; and
a first polarizing structure disposed on the first display structure and the second display structure, wherein the first display structure is disposed between the first substrate and the first polarizing structure;
wherein the first polarizing structure includes a first polarizing layer disposed on the first display structure and a second polarizing layer disposed on the second display structure, and the first polarizing layer and the second polarizing layer are separated;
wherein the first display structure and the second display structure are different from each other and are selected from a group consisting of:
a liquid-crystal display;
an organic light-emitting diode display;
an inorganic light-emitting diode display; and
a laser display; and a second display unit connected to the first display unit along a first direction in a side-by-side manner, comprising:
a third substrate;
a third display structure disposed on the third substrate;
a fourth display structure disposed on the third substrate; and
a third polarizing structure disposed on the third display structure and the fourth display structure;
wherein the third display structure and the fourth display structure are different from each other and are selected from a group consisting of:
a liquid-crystal display;
an organic light-emitting diode display;
an inorganic light-emitting diode display; and
a laser display.

2. The display device as claimed in claim 1, wherein the first display structure comprises a plurality of first pixels and the second display structure comprises a plurality of second pixels, wherein the plurality of first pixels have a first pitch, and two adjacent one of the plurality of the first pixels and one of the plurality of the second pixels define a second pitch, and wherein a ratio of the first pitch to the second pitch ranges from 0.8 to 1.2.

3. The display device as claimed in claim 1, wherein the first display structure comprises a plurality of first pixels, the second display structure comprises a plurality of second pixels, and the third display structure comprises a plurality of third pixels, wherein the plurality of first pixels have a first pitch, and two adjacent one of the plurality of the second pixels and one of the plurality of the third pixels define a third pitch, and wherein a ratio of the first pitch to the third pitch ranges from 0.8 to 1.2.

4. The display device as claimed in claim 1, wherein the second display structure comprises a plurality of second pixels, the third display structure comprises a plurality of third pixels, each of the second pixels comprises at least three second subpixels of different colors, each of the third pixels comprises at least three third subpixels of different colors,
wherein the first display unit and the second display unit are connected by connection between a first connecting side of the first substrate and a second connecting side of the third substrate, and
wherein two adjacent second pixels are spaced apart from each other by a first distance, a distance between the second subpixel nearest to the first connecting side defines a second distance, a distance between the third subpixel nearest to the second connecting side defines a third distance, and a ratio of the first distance to the sum of the second distance and the third distance ranges from 0.8 to 1.2.

5. The display device as claimed in claim 1, wherein the first substrate includes a foldable region, and the second display structure is disposed on the foldable region.

6. The display device as claimed in claim 1, wherein the first display structure is an organic light-emitting diode display, and the second display structure is an inorganic light-emitting diode display.

7. The display device as claimed in claim 6, wherein the organic light-emitting diode display includes a pixel including organic light-emitting diode subpixels, and the inorganic light-emitting diode display includes a pixel including inorganic light-emitting diode subpixels.

8. The display device as claimed in claim 6, wherein the display device is a wearable display device, the first display structure comprises a watch portion, and the second display structure comprises a belt portion.

9. The display device as claimed in claim 1, wherein an upper surface of the first polarizing layer and an upper surface of the second polarizing layer are non-coplanar.

10. The display device as claimed in claim 1, further comprising a protecting layer, wherein the second display structure is disposed between the first substrate and the second polarizing layer, and the protecting layer is disposed between the second polarizing layer and second display structure.

11. A display device, comprising:
a first substrate;
a first display structure disposed on the first substrate;
a second display structure disposed on the first substrate; and
a first polarizing structure disposed on the first substrate and the second display structure, wherein the first display structure is disposed between the first substrate and the first polarizing structure;
wherein the first polarizing structure includes a first polarizing layer disposed on the first display structure and a second polarizing layer disposed on the second display structure, and the first polarizing layer and the second polarizing layer are separated, and
wherein the first display structure is an organic light-emitting diode display, and the second display structure is an inorganic light-emitting diode display.

12. The display device as claimed in claim 11, wherein a resolution of the first display structure is different from a resolution of the second display structure.

13. The display device as claimed in claim 11, wherein the first substrate includes a foldable region, and the second display structure is disposed on the foldable region.

14. The display device as claimed in claim 11, wherein the organic light-emitting diode display includes a pixel including organic light-emitting diode subpixels, and the inorganic light-emitting diode display includes a pixel including inorganic light-emitting diode subpixels.

15. The display device as claimed in claim 11, wherein the display device is a wearable display device, the first display structure comprises a watch portion, and the second display structure comprises a belt portion.

16. The display device as claimed in claim 11, further comprising a protecting layer, wherein the second display structure is disposed between the first substrate and the second polarizing layer, and the protecting layer is disposed between the second polarizing layer and second display structure.

17. The display device as claimed in claim 11, further comprising an adhesive layer disposed between the first display structure and the first substrate.

18. A display device, comprising:
a first substrate;
a first display structure disposed on the first substrate;
a second display structure disposed on the first substrate; and
a first polarizing structure disposed on the first substrate and the second display structure, wherein the first display structure is disposed between the first substrate and the first polarizing structure;
wherein the first polarizing structure includes a first polarizing layer disposed on the first display structure and a second polarizing layer disposed on the second display structure, and the first polarizing layer and the second polarizing layer are separated, wherein an upper surface of the first polarizing layer and an upper surface of the second polarizing layer are non-coplanar, and wherein the first display structure and the second display structure are different from each other and are selected from a group consisting of:

a liquid-crystal display;
an organic light-emitting diode display;
an inorganic light-emitting diode display; and
a laser display.

19. The display device as claimed in claim 18, wherein a resolution of the first display structure is different from a resolution of the second display structure.

\* \* \* \* \*